US012777750B2

(12) United States Patent
Kim et al.

(10) Patent No.: US 12,777,750 B2
(45) Date of Patent: Oct. 27, 2026

(54) LIGHT EMITTING ELEMENT, DISPLAY DEVICE INCLUDING THE SAME, AND METHOD OF FABRICATING LIGHT EMITTING ELEMENT

(71) Applicant: Samsung Display Co., LTD., Yongin-si (KR)

(72) Inventors: Hyung Seok Kim, Yongin-si (KR); Hye Lim Kang, Yongin-si (KR); Si Sung Kim, Yongin-si (KR); Jong Jin Lee, Yongin-si (KR); Dong Eon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 554 days.

(21) Appl. No.: 18/316,513

(22) Filed: May 12, 2023

(65) Prior Publication Data

US 2024/0128409 A1 Apr. 18, 2024

(30) Foreign Application Priority Data

Oct. 17, 2022 (KR) ........................ 10-2022-0133544

(51) Int. Cl.
*H10H 20/831* (2025.01)
*H10H 20/857* (2025.01)
*H10W 90/00* (2026.01)
*H10H 20/01* (2025.01)

(52) U.S. Cl.
CPC ...... *H10H 20/8312* (2025.01); *H10H 20/857* (2025.01); *H10W 90/00* (2026.01); *H10H 20/032* (2025.01)

(58) Field of Classification Search
CPC ............. H10H 20/8312; H10H 20/857; H10H 20/032; H10H 20/831; H10H 20/84; H10H 20/819; H10H 29/24; H10W 90/00; H10K 50/10; H10K 50/805; H10K 59/12; H10K 71/60
See application file for complete search history.

(56) References Cited

U.S. PATENT DOCUMENTS 6,727,792 B2 * 4/2004 Amada ................. H01F 27/292 336/200
7,427,785 B2 9/2008 Song
7,462,861 B2 * 12/2008 Slater, Jr. ............. H10H 20/832 257/40

(Continued)

FOREIGN PATENT DOCUMENTS

KR 10-0720101 5/2007
KR 10-2015-0073521 A 7/2015

(Continued)

*Primary Examiner* — Su C Kim
(74) *Attorney, Agent, or Firm* — Womble Bond Dickinson (US) LLP

(57) ABSTRACT

A light emitting element may include a first semiconductor layer, an emission layer disposed on the first semiconductor layer, a second semiconductor layer disposed on the emission layer, an insulating film, and an electrode layer. The insulating film may enclose a side surface of the first semiconductor layer, a side surface of the emission layer, and a side surface of the second semiconductor layer. The electrode layer may be disposed on the second semiconductor layer and the insulating film. The insulating film may not enclose the electrode layer.

19 Claims, 23 Drawing Sheets

(56) References Cited

U.S. PATENT DOCUMENTS

| | | | | |
|---|---|---|---|---|
| 7,511,311 | B2 * | 3/2009 | Kususe .............. | H10H 20/8314 257/94 |
| 7,585,615 | B2 * | 9/2009 | Schultz ............... | H10W 72/012 430/311 |
| 9,748,446 | B2 | 8/2017 | Jeon et al. | |
| 10,910,512 | B2 | 2/2021 | Sung | |
| 2017/0317228 | A1 * | 11/2017 | Sung ...................... | H10H 20/84 |
| 2022/0108979 | A1 | 4/2022 | Lee et al. | |

FOREIGN PATENT DOCUMENTS

| | | |
|---|---|---|
| KR | 10-2016-0059576 A | 5/2016 |
| KR | 10-1674052 | 11/2016 |
| KR | 10-2022-0046740 | 4/2022 |

* cited by examiner

MK: MK1, MK2

LIGHT EMITTING ELEMENT, DISPLAY DEVICE INCLUDING THE SAME, AND METHOD OF FABRICATING LIGHT EMITTING ELEMENT

CROSS-REFERENCE TO RELATED APPLICATION(S)

This application claims priority to and benefits of Korean patent application No. 10-2022-0133544 under 35 U.S.C. § 119, filed on Oct. 17, 2022 in the Korean Intellectual Property Office, the entire contents of which are incorporated herein by reference.

BACKGROUND

1. Technical Field

Various embodiments of the disclosure relate to a light emitting element, a display device including the light emitting element, and a method of fabricating the light emitting element.

2. Description of Related Art

Recently, interest in information displays is increasingly growing. Hence, research and development on display devices is continuously performed.

SUMMARY

Various embodiments of the disclosure are directed to a light emitting element having improved light characteristics and capable of preventing a short circuit from occurring, a display device including the light emitting element, and a method of fabricating the light emitting element.

Aspects of the disclosure are not limited to the above-stated aspect, and those skilled in the art will clearly understand other unmentioned aspects from the accompanying description.

An embodiment of the disclosure may provide a light emitting element that may include a first semiconductor layer, an emission layer disposed on the first semiconductor layer, a second semiconductor layer disposed on the emission layer, an insulating film enclosing a side surface of the first semiconductor layer, a side surface of the emission layer, and a side surface of the second semiconductor layer, and an electrode layer disposed on the second semiconductor layer and the insulating film. The insulating film may not enclose the electrode layer.

An upper surface of the second semiconductor layer and an upper surface of the insulating film may be located in a substantially identical plane. The electrode layer may be directly disposed on the upper surface of the insulating film.

A diameter of the first semiconductor layer and a diameter of the second semiconductor layer may be substantially identical to each other.

A thickness of a portion of the insulating film that physically contacts the second semiconductor layer and a thickness of another portion of the insulating film that physically contacts the first semiconductor layer may be substantially identical to each other.

The electrode layer may have a bottle cap shape.

In a plan view, the electrode layer may include protrusions protruding further than sides of a virtual hexagon corresponding to the light emitting element.

Per one side of the virtual hexagon, the electrode layer may include at least two protrusions.

In a plan view, a diameter of the electrode layer may be greater than a diameter of the insulating film.

The electrode layer may partially cover a side surface of the insulating film that is adjacent to an upper surface of the insulating film.

Relative to an upper surface of the second semiconductor layer, the electrode layer may have an inclination angle of about 90° or less.

Relative to an upper surface of the second semiconductor layer, the electrode layer may have an inclination angle of about 90° or more.

On a boundary between the insulating film and the electrode layer, a diameter of the electrode layer may be greater than a diameter of the second semiconductor layer and less than a diameter of the insulating film.

Relative to an upper surface of the second semiconductor layer, the electrode layer may have an inclination angle of about 90° or less.

Relative to an upper surface of the second semiconductor layer, the electrode layer may have an inclination angle of about 90° or more.

An embodiment of the disclosure may provide a display device that may include a pixel including a first electrode, a second electrode, and a light emitting element including a first end electrically connected to the first electrode, and a second end electrically connected to the second electrode. The light emitting element may include a first semiconductor layer, an emission layer, a second semiconductor layer, and an electrode layer that are successively disposed in a direction from the second end to the first end, and an insulating film enclosing a side surface of the first semiconductor layer, a side surface of the emission layer, and a side surface of the second semiconductor layer. The electrode layer may partially cover the insulating film. The insulating film may not enclose the electrode layer.

A diameter of the first semiconductor layer and a diameter of the second semiconductor layer may be substantially identical to each other.

The electrode layer may have a bottle cap shape. The electrode layer may include protrusions protruding in a width direction of the light emitting element.

An embodiment of the disclosure may provide a method of fabricating a light emitting device. The method may include successively forming a first semiconductor layer, an emission layer and a second semiconductor layer on a substrate, patterning a stack including the first semiconductor layer, the emission layer, and the second semiconductor layer in a rod shape, forming an insulating film on a side surface of the stack, forming an electrode layer on the second semiconductor layer and the insulating film, and separating a light emitting element including the stack, the insulating film, and the electrode layer from the substrate.

The forming of the electrode layer may include primarily forming, using a sputtering technique, the electrode layer that covers only an upper end of the stack, and etching, using a wet etching technique, the electrode layer primarily formed.

A diameter of the first semiconductor layer and a diameter of the second semiconductor layer may be substantially identical to each other.

The electrode layer may have a bottle cap shape. The electrode layer may include protrusions protruding in a width direction of the light emitting element.

Details of various embodiments are included in the detailed descriptions and drawings.

DETAILED DESCRIPTION OF THE EMBODIMENTS

Figure 1:
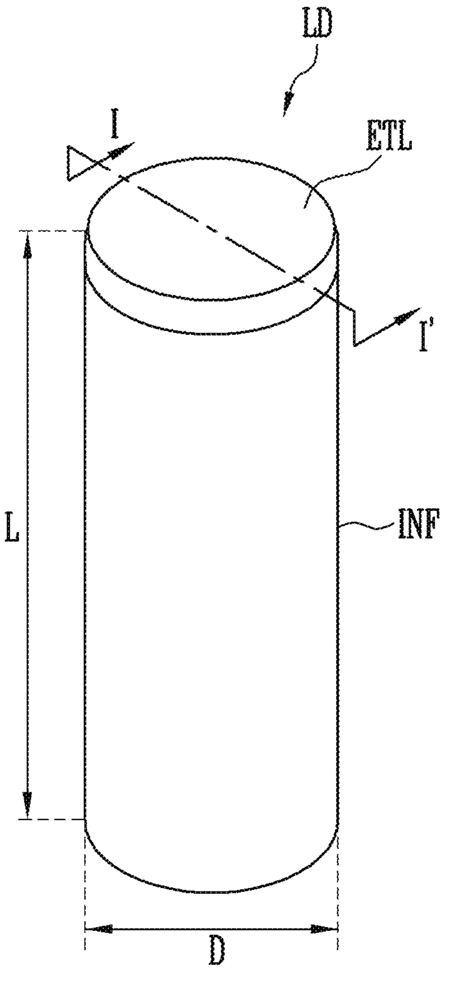
FIG. 1 is a perspective view schematically illustrating a light emitting element in accordance with embodiments.

As the disclosure allows for various changes and numerous embodiments, only some particular embodiments can be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. When it is expressed that a first part such as a layer, a film, a region, or a plate is formed on a second part, the surface of the second part on which the first part is formed is not limited to an upper surface of the second part but may include other surfaces such as a side surface or a lower surface of the second part. In case that a first part such as a layer, a film, a region, or a plate is under a second part, the first part may be not only directly under the second part but a third part may intervene between them.

Advantages and features of the disclosure, and methods for achieving the same will be disclosed with reference to embodiments described in detail together with the accompanying drawings. However, it is to be noted that the disclosure is not limited to the embodiments but can be embodied in various other ways. In this specification, "connected/coupled" refers to one component not only directly connected to another component but also indirectly connected to another component through an intermediate component. In addition, in an embodiment of the disclosure, the term "connection" between two components may embrace electrical connection and/or physical connection.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
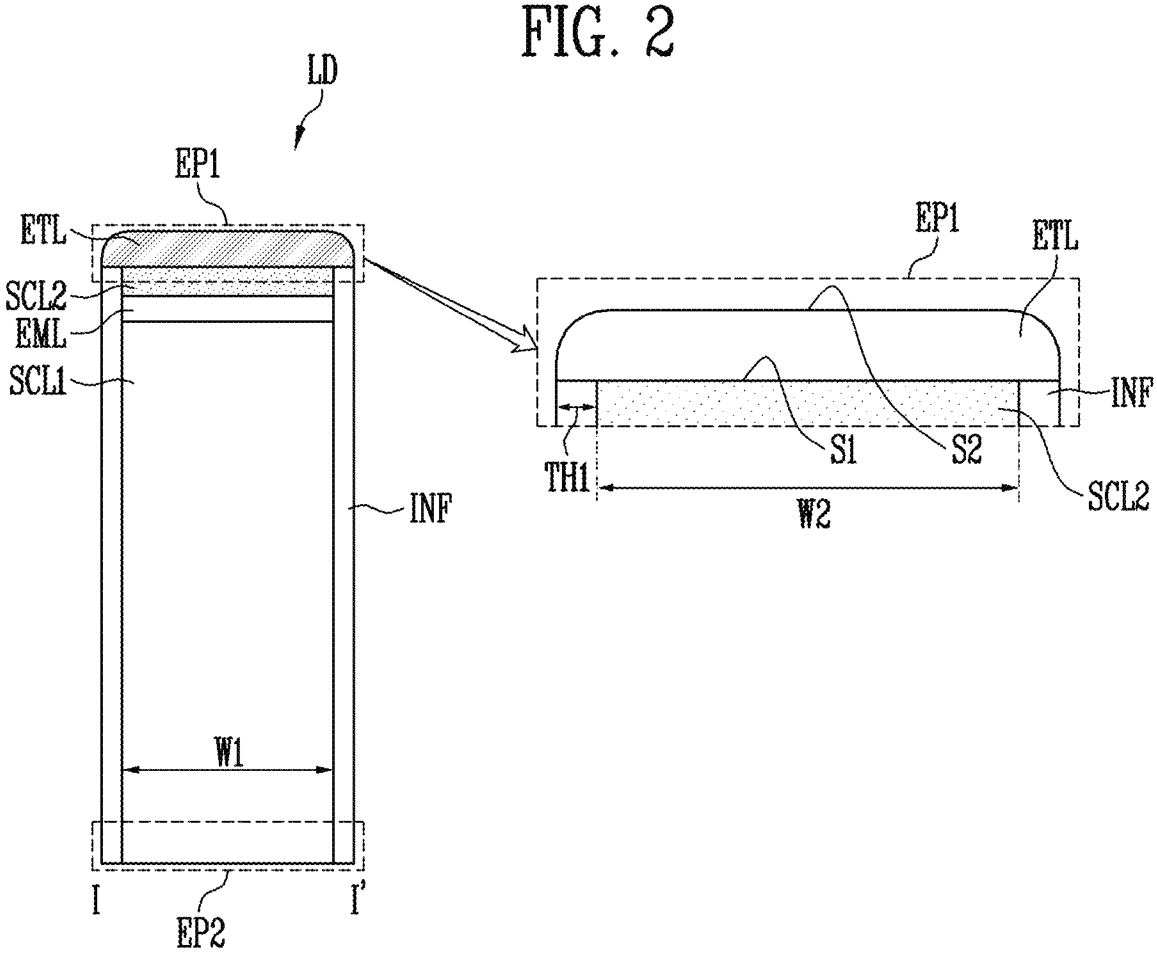
FIG. 2 is a sectional view schematically illustrating an embodiment of the light emitting element of FIG. 1.
Figure 3:
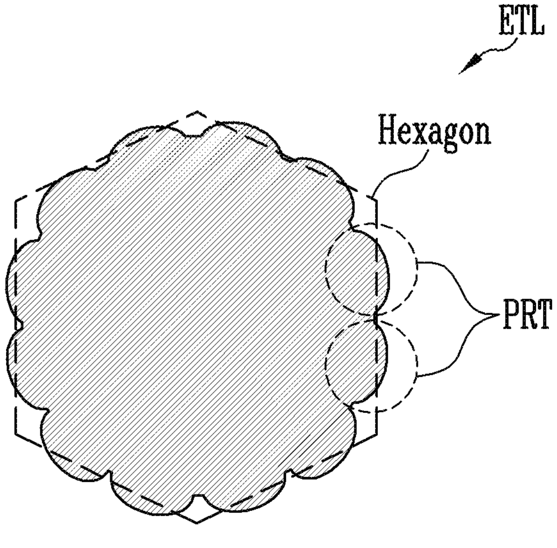
FIG. 3 is a plan view schematically illustrating an embodiment of the light emitting element of FIG. 1.

FIG. 1 is a perspective view schematically illustrating a light emitting element LD in accordance with embodiments. FIG. 2 is a sectional view schematically illustrating an embodiment of the light emitting element LD of FIG. 1. For example, FIG. 2 illustrates an embodiment of a cross-section of the light emitting element LD corresponding to line I-I' of FIG. 1. FIG. 3 is a schematic plan view illustrating an embodiment of the light emitting element LD of FIG. 1. FIG. 3 illustrates the light emitting element LD when seen in a longitudinal direction of the light emitting element LD and, for example, illustrates an embodiment of a plan view of an electrode layer ETL.

Referring to FIGS. 1 and 2, the light emitting element LD may include a first semiconductor layer SCL1, an emission layer EML, a second semiconductor layer SCL2, and an electrode layer ETL, which are successively disposed and/or stacked in a direction (e.g., in a longitudinal direction or a thickness direction). In an embodiment, the light emitting element LD may further include at least one other semiconductor layer (e.g., at least one other semiconductor layer disposed over and/or under the emission layer EML) and/or at least one electrode layer (e.g., an electrode layer disposed around the first semiconductor layer SCL1).

In an embodiment, the light emitting element LD may be provided in a rod-like shape. In the descriptions of embodiments of the disclosure, the term "rod-like shape" may embrace various types of rod-like shapes or bar-like shapes including a cylindrical shape or a polygonal shape, and the cross-sectional shape thereof is not particularly limited. In an embodiment, a length L of the light emitting element LD may be greater than a diameter D thereof (or a width of the cross-section thereof).

In an embodiment, the light emitting element LD may have a small size ranging from the nanometer to the micrometer. For example, the light emitting element LD may have a diameter D (or a width of the cross-section thereof) and/or a length L ranging from the nanometer to the micrometer. For example, the light emitting element LD may have a diameter D and/or a length L ranging from approximately several tens of nanometers to approximately several tens of micrometers. For example, the length L of the light emitting element LD may range from approximately 1 μm to approximately 10 μm, or may range from approximately 3.5 μm to approximately 4 μm. The diameter D of the light emitting element LD may range from approximately 0.1 μm to approximately 1 μm or may range from approximately 500 nm to approximately 600 nm. Here, the size of the light emitting element LD may be changed.

The light emitting element LD may include a first end EP1 and a second end EP2 which face each other. For example, the light emitting element LD may include a first end EP1 and a second end EP2 on opposite ends thereof in the longitudinal direction (or the thickness direction). The first end EP1 of the light emitting element LD may include a first base surface (e.g., an upper surface) of the light emitting element LD and/or a peripheral area thereof. The second end EP2 of the light emitting element LD may include a second base surface (e.g., a lower surface) of the light emitting element LD and/or a peripheral area thereof.

In an embodiment, the first semiconductor layer SCL1, the emission layer EML, the second semiconductor layer SCL2, and the electrode layer ETL may be disposed successively in a direction from the second end EP2 of the light emitting element LD to the first end EP1 thereof. For example, the electrode layer ETL may be disposed on the first end EP1 of the light emitting element LD. The first semiconductor layer SCL1 (or another electrode disposed adjacent to the first semiconductor layer SCL1 and electrically connected to the first semiconductor layer SCL1) may be disposed on the second end EP2 of the light emitting element LD.

The light emitting element LD may further include an insulating film INF which encloses side surfaces of the first semiconductor layer SCL1, the emission layer EML, and the second semiconductor layer SCL2. The insulating film INF may not enclose the electrode layer ETL.

The first semiconductor layer SCL1 may include a first conductive semiconductor layer including a first conductive dopant. For example, the first semiconductor layer SCL1 may be an N-type semiconductor layer including an N-type dopant.

In an embodiment, the first semiconductor layer SCL1 may include nitride-based semiconductor material or phosphide-based semiconductor material. For example, the first semiconductor layer SCL1 may include nitride-based semiconductor material including at least one material among GaN, AlGaN, InGaN, InAlGaN, AlN, and InN, or may include phosphide-based semiconductor material including at least one material among GaP, InGaP, AlGaP, InAlGaP, AlP and InP. In an embodiment, the first semiconductor layer SCL1 may include an N-type dopant such as Si, Ge, and Sn. However, the material for forming the first semiconductor layer SCL1 is not limited to the foregoing, and various other materials may be used to form the first semiconductor layer SCL1.

The emission layer EML (or referred to as "active layer") may be disposed on the first semiconductor layer SCL1. The emission layer EML may include a single- or multi-quantum well (QW) structure. If a voltage equal to or greater than a threshold voltage is applied between the opposite ends of the light emitting element LD, the light emitting element LD may emit light by coupling of electron-hole pairs in the emission layer EML.

In an embodiment, the emission layer EML may emit light of a visible ray wavelength band, e.g., light of a wavelength band ranging from approximately 400 nm to approximately 900 nm. For example, the emission layer EML may emit blue light having a wavelength ranging from approximately 450 nm to approximately 480 nm, green light having a wavelength ranging from approximately 480 nm to approximately 560 nm, or red light having a wavelength ranging from approximately 620 nm to approximately 750 nm. The color and/or wavelength band of light generated from the emission layer EML may be changed.

In an embodiment, the emission layer EML may include nitride-based semiconductor material or phosphide-based semiconductor material. For example, the emission layer EML may include nitride-based semiconductor material including at least one material among GaN, AlGaN, InGaN, InAlGaN, AlN, InN, and AlInN, or may include phosphide-based semiconductor material including at least one material among GaP, InGaP, AlGaP, InAlGaP, AlP and InP. The material that forms the emission layer EML is not limited thereto. Various other materials may be used to form the emission layer EML.

In an embodiment, the emission layer EML may include an element involved in the color (or the wavelength band) of light. The color of light generated from the emission layer EML may be controlled by adjusting the content and/or composition ratio of the element. For example, the emission layer EML may have a multilayer structure formed by alternately and/or repeatedly stacking GaN layers and InGaN layers, and may emit light of a specific color determined depending on the content and/or composition ratio of indium (In) included in the InGaN layer. Therefore, the light emitting element LD capable of emitting a desired color of light may be fabricated by adjusting the content and/or composition ratio of indium (In) included in the emission layer EML.

The second semiconductor layer SCL2 may be disposed on the emission layer EML. The second semiconductor layer SCL2 may include a second conductive semiconductor layer including a second conductive dopant. For example, the second semiconductor layer SCL2 may be a P-type semiconductor layer including a P-type dopant.

In an embodiment, the second semiconductor layer SCL2 may include nitride-based semiconductor material or phosphide-based semiconductor material. For example, the second semiconductor layer SCL2 may include nitride-based semiconductor material including at least one material among GaN, AlGaN, InGaN, InAlGaN, AlN, and InN, or may include phosphide-based semiconductor material including at least one material among GaP, InGaP, AlGaP, InAlGaP, AlP and InP. In an embodiment, the second semiconductor layer SCL2 may include a P-type dopant such as Mg. However, the material for forming the second semiconductor layer SCL2 is not limited to the foregoing, and various other materials may be used to form the second semiconductor layer SCL2.

In an embodiment, the first semiconductor layer SCL1 and the second semiconductor layer SCL2 may include an identical semiconductor material, and may include different types of conductive dopants. In an embodiment, the first semiconductor layer SCL1 and the second semiconductor layer SCL2 may include different semiconductor materials, and may include different types of conductive dopants.

In an embodiment, the first semiconductor layer SCL1 and the second semiconductor layer SCL2 may have different lengths (or thicknesses) with respect to the longitudinal direction of the light emitting element LD. For example, the first semiconductor layer SCL1 may have a length (or a thickness) greater than that of the second semiconductor layer SCL2 with respect to the longitudinal direction of the light emitting element LD. Hence, the emission layer EML may be disposed closer to the first end EP1 (e.g., a P-type end) than to the second end EP2 (e.g., an N-type end).

In an embodiment, the first semiconductor layer SCL1 and the second semiconductor layer SCL2 may have an identical width (or diameter). For example, the first semiconductor layer SCL1 may have a uniform first width W1 in the longitudinal direction of the light emitting element LD. The second semiconductor layer SCL2 may have a uniform second width W2 in the longitudinal direction of the light emitting element LD. The first width W1 and the second width W2 may be substantially the same as each other.

The insulating film INF may be provided on the surface of the light emitting element LD to enclose the side surfaces of the first semiconductor layer SCL1, the emission layer EML, and the second semiconductor layer SCL2.

In the case where the insulating film INF is provided on the surface of the light emitting element LD, a short circuit through the light emitting element LD may be prevented from occurring. Consequently, the electrical stability of the light emitting element LD may be secured. Furthermore, if the insulating film INF is provided on the surface of the light emitting element LD, occurrence of a defect on the surface of the light emitting element LD may be minimized, whereby the lifetime and efficiency of the light emitting element LD may be improved.

The insulating film INF may include transparent insulating material. Thereby, light generated from the emission layer EML may be emitted out of the light emitting element LD after passing through the insulating film INF. For example, the insulating film INF may include at least one insulating material among silicon oxide ($SiO_x$, e.g., $SiO_2$), silicon nitride ($SiN_x$, e.g., $Si_3N_4$), aluminum oxide ($Al_xO_y$, e.g., $Al_2O_3$), titanium oxide ($Ti_xO_y$, e.g., $TiO_2$), and hafnium oxide ($HfO_x$), or other insulating materials.

The insulating film INF may have a single-layer structure or a multi-layer structure. For example, the insulating film INF may have a double layer structure.

The insulating film INF may allow the first semiconductor layer SCL1 and the second semiconductor layer SCL2 to be exposed, respectively, on the first end EP1 and the second end EP2 of the light emitting element LD. For example, the insulating film INF may not be provided on an upper surface of the second semiconductor layer SCL2, so that the upper surface of the second semiconductor layer SCL2 can be exposed on the first end EP1 of the light emitting element LD. Furthermore, the insulating film INF may be provided on a lower surface of the first semiconductor layer SCL1 (e.g., a bottom surface of the light emitting element LD), so that the lower surface of the first semiconductor layer SCL1 can be exposed on the second end EP2 of the light emitting element LD. Hence, the first semiconductor layer SCL1 and the second semiconductor layer SCL2 each may be connected to at least one electrode, line, and/or conductive pattern so that driving voltages and/or signals can be applied to the first end EP1 and the second end EP2 of the light emitting element LD.

The insulating film INF may completely enclose the side surface of the second semiconductor layer SCL2. Hence, the electrical stability of the light emitting element LD can be secured, so that a short circuit through the light emitting element LD can be prevented from occurring.

In an embodiment, the insulating film INF may have an overall uniform thickness. For example, the insulating film INF may have a uniform thickness (e.g., a first thickness TH1) in an overall area that encloses the second semiconductor layer SCL2, the emission layer EML, and the first semiconductor layer SCL1. For example, a thickness of a portion of the insulating film INF that contacts the second semiconductor layer SCL2 may be substantially the same as a thickness of another portion of the insulating film INF that contacts the first semiconductor layer SCL1. For example, the insulating film INF may have a first thickness TH1 of about 10 nm or more in the overall area that encloses the second semiconductor layer SCL2, the emission layer EML, and the first semiconductor layer SCL1. Because the insulating film INF has an overall uniform thickness, the insulating film INF may have a surface profile corresponding to the shapes of the side surfaces of the first semiconductor layer SCL1, the emission layer EML, and the second semiconductor layer SCL2.

Furthermore, the insulating film INF may have a thickness enabling the insulating film INF to remain on the side surfaces of the second semiconductor layer SCL2 and the emission layer EML even if the insulating film INF around the second semiconductor layer SCL2 and/or the emission layer EML is etched by a partial thickness due to an over-etching event which may occur during a process of etching the insulating film INF to expose the electrode layer ETL on the first end and/or other subsequent processes (e.g., a pixel process for forming a pixel using the light emitting element LD). For example, the insulating film INF may be formed to have a thickness (e.g., a thickness of about 10 nm or more) sufficient to reliably enclose the second semiconductor layer SCL2 and the emission layer EML, taking into account a margin for over-etching which may occur during a subsequent process.

The thickness, the surface profile, and/or the like of the insulating film INF may be changed depending on embodiments. For example, depending on a process scheme, process conditions, materials, and/or the like which are used to form the insulating film INF, the thickness and/or the surface profile of the insulating film INF may be changed. In an embodiment, in the case where the insulating film INF is formed by using an atomic layer deposition (ALD) processing technique capable of forming a film having a high step coverage, the insulating film INF may have a surface profile corresponding to (e.g., following) the shape of the side surfaces of the first semiconductor layer SCL1, the emission layer EML, the second semiconductor layer SCL2, and the electrode layer ETL, and the insulating film INF may have an overall uniform thickness.

The electrode layer ELT may be disposed on the second semiconductor layer SCL2 and the insulating film INF in the longitudinal direction of the light emitting element LD. For example, the electrode layer ETL may be directly disposed on the second semiconductor layer SCL2 and the insulating film INF so that the electrode layer ETL contacts both the upper surface of the second semiconductor layer SCL2 and an upper surface of the insulating film INF on a first surface S1. The upper surface of the second semiconductor layer SCL2 and the upper surface of the insulating film INF may be disposed on substantially the same plane (e.g., the same plane as the first surface S1).

The electrode layer ETL may protect the second semiconductor layer SCL2 and form an electrode for effectively connecting the second semiconductor layer SCL2 to an electrode, a line, and/or the like. For example, the electrode layer ETL may be an Ohmic contact electrode or a Schottky contact electrode.

In an embodiment, the electrode layer ETL may include metal or metal oxide. For example, the electrode layer ETL may be formed of transparent conductive materials such as chromium (Cr), titanium (Ti), aluminum (Al), gold (Au), nickel (Ni), copper (Cu), oxides or alloys thereof, indium tin oxide (ITO), indium zinc oxide (IZO), indium tin zinc oxide (ITZO), zinc oxide (ZnO), tin dioxide (SnO2), or indium oxide (In2O3), alone or in combination. The material that forms the electrode layer ETL is not limited to the foregoing. Various other materials may be used to form the electrode layer ETL.

In an embodiment, the electrode layer ETL may be substantially transparent. Hence, light generated from the light emitting element LD may be emitted from the first end EP1 of the light emitting element LD after passing through the electrode layer ETL.

The electrode layer ETL may include a first surface S1 (e.g., a lower surface of the electrode layer ETL) and a second surface S2 (e.g., an upper surface of the electrode layer ETL). Furthermore, the electrode layer ETL may include a side surface (also referred to as "third surface" of the electrode layer ETL) which connects the first surface S1 to the second surface S2. The first surface S1 and the second surface S2 of the electrode layer ETL may have different widths and/or surface areas. For example, the first surface S1 of the electrode layer ETL may have a width and/or a surface area greater (e.g., wider) than the second surface S2 of the electrode layer ETL. The width and/or the surface area of the first surface S1 of the electrode layer ETL may be greater than the width and/or the surface area of the second semiconductor layer SCL2. The width and/or the surface area of the second surface S2 of the electrode layer ETL may be less than or identical to the width and/or the surface area of the second semiconductor layer SCL2, but the disclosure is not limited thereto. For example, the width and/or the surface area of the second surface S2 of the electrode layer ETL may be greater than the width and/or the surface area of the second semiconductor layer SCL2. The side surface S3 of the electrode layer ETL may have a slope inclined at an angle within a certain range with respect to the first surface S1 of the electrode layer ETL (or the bottom surface of the light emitting element LD). For example, the side surface S3 of the electrode layer ETL may have an inclination corresponding to an angle approximately ranging from about 45° to about 90°. The electrode layer ETL may have a tapered cross-sectional shape, but the disclosure is not limited thereto.

In an embodiment, the electrode layer ETL may completely enclose or cover the upper surface of the insulating film INF. However, the disclosure is not limited to the foregoing, and the electrode layer ETL may cover only a portion of the upper surface of the insulating film INF.

In an embodiment, the electrode layer ETL may have a thickness approximately ranging from approximately 100 nm to approximately 200 nm. The thickness of the electrode layer ETL may be changed in various ways, depending on embodiments. In the case where the electrode layer ETL has a relatively small thickness (e.g., an example thickness ranging from approximately 100 nm to approximately 200 nm), a reduction in light output efficiency of the light emitting element LD resulting from the formation of the electrode layer ETL may be prevented or minimized.

In embodiments, the electrode layer ETL may have a bottle cap shape (or profile), and include a protrusion PRT protruding in a width direction of the light emitting element LD. Compared to an electrode layer having a circular shape, the electrode layer ETL having a bottom cap shape may have large or increased roughness.

Referring to FIGS. 1 to 3, the electrode layer ETL may include a protrusion PRT which protrudes further than a side of a hexagon (e.g., virtual hexagon). Here, the hexagon may correspond to an outer circumferential surface of the light emitting element LD (or the insulating film INF, or the second semiconductor layer SCL2). The diameter of the hexagon may be the same as the diameter D of the light emitting element LD. A center of a surface area of the hexagon may correspond to a center of a surface area of the light emitting element LD. Although for convenience of explanation the hexagon has been described, the planar shape of the light emitting element LD is not limited to a hexagon.

In an embodiment, per one side of the hexagon, the electrode layer ETL may include at least one protrusion PRT. For example, the electrode layer ETL may include two protrusions PRT per one side of the hexagon. However, the disclosure is not limited to the foregoing. The electrode layer ETL may include three or more protrusions PRT per one side of the hexagon.

Although will be described with reference to FIGS. 16 and 17, the electrode layer ETL may be deposited in the form of a sphere enclosing the second semiconductor layer SCL2 and the insulating film INF. The electrode layer ETL may be processed through an etching (e.g., a wet etching) process to have a bottle cap shape (or profile).

In the case where the electrode layer ETL has a bottle cap shape or include the protrusion PRT, the electrode layer ETL may have a relatively large (wide) surface area (or contact area). For example, in the case where the electrode ETL is connected to an electrode or line (e.g., an electrode or line for applying a driving power voltage and/or a signal), the electrode layer ETL may be more reliably connected to the electrode or the line by a relatively large contact area.

The structure, the shape, the size, and/or the type of the light emitting element LD may be changed depending on embodiments. For example, the structure, the shape, the size, and/or the type of the light emitting element LD may be changed in various ways depending on design conditions of a light emitting device using the light emitting element LD, or desired emission characteristics.

A light emitting device including the light emitting element LD may be used in various devices which may require a light source. For instance, multiple light emitting elements LD may be disposed in a pixel of a display device, so that the light emitting elements LD may be used as a light source of the pixel. The light emitting element LD may also be used in various devices such as a lighting device, which requires a light source.

Figure 4:
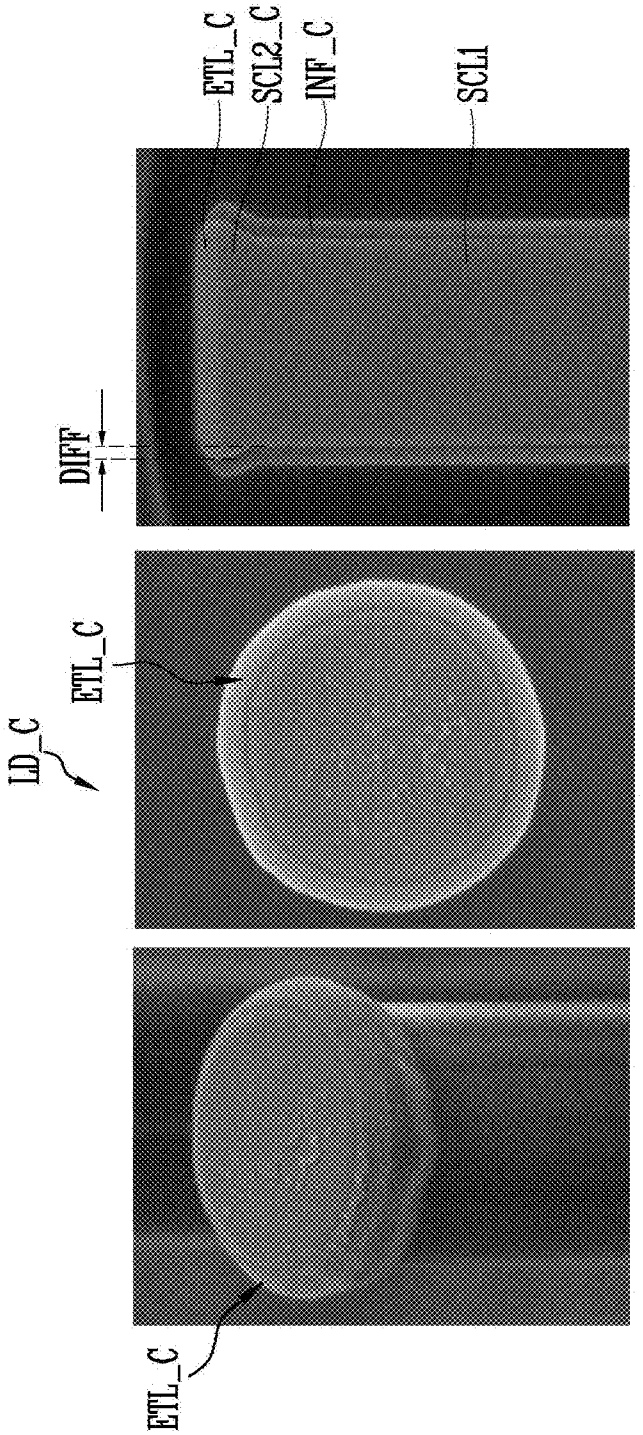
FIG. 4 is a diagram schematically illustrating a comparative example of a light emitting element.
Figure 5:
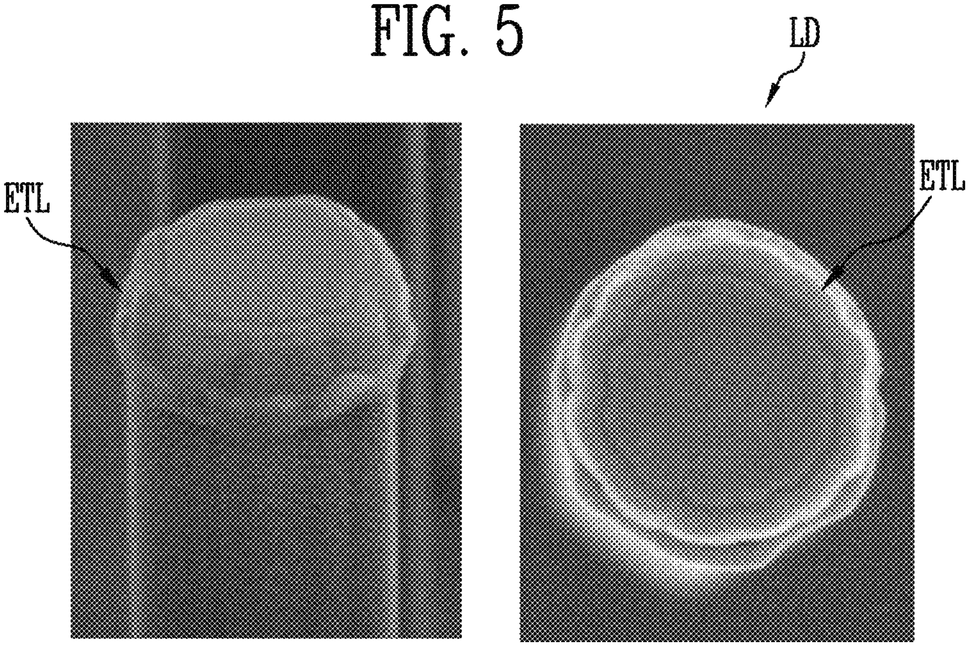
FIG. 5 is a diagram schematically illustrating an embodiment of the light emitting element of FIG. 1.

FIG. 4 is a diagram schematically illustrating a comparative example of a light emitting element. FIG. 4 illustrates images (or captured images) corresponding to a perspective view, a plan view, and a sectional view (or a side surface) of a light emitting element LD_C). FIG. 5 is a diagram schematically illustrating an embodiment of the light emitting element LD of FIG. 1. FIG. 5 illustrates images corresponding to a perspective view and a plan view of the light emitting element LD.

Referring to FIGS. 1 to 4, the light emitting element LD_C in accordance with the comparative example, other than the shape thereof, is similar to the light emitting element LD of FIGS. 1 and 2; therefore, repetitive explanation thereof will be omitted.

In the light emitting element LD_C of FIG. 4, an electrode layer ETL_C may be disposed on a second semiconductor layer SCL2_C, and an insulating film INF_C may cover or enclose at least a portion of a side surface of the electrode layer ETL_C. In other words, the electrode layer ETL_C may not cover the insulating film INF_C, and the insulating film INF_C may partially cover the electrode layer ETL_C. The electrode layer ETL_C may have a circular planar shape.

For reference, the second semiconductor layer SCL2_C and the electrode layer ETL_C are successively stacked on the first semiconductor layer SCL1. A stack having a rod shape is formed by collectively etching the first semiconductor layer SCL1 to the electrode layer ETL_C. The insulating film INF_C may be formed to enclose an outer circumferential surface of the stack (i.e., the first semiconductor layer SCL1 to the electrode layer ETL_C). The electrode layer ETL_C and the first and second semiconductor layers SCL1 and SCL2_C may differ in etch rate (or etch selectivity, etch velocity) from each other. The second semiconductor layer SCL2_C adjacent to a lower portion of the electrode layer ETL_C may not be etched relatively to the electrode layer ETL_C. Hence, a diameter of the second semiconductor layer SCL2_C may be greater than that of the first semiconductor layer SCL1. For example, the second semiconductor layer SLC2_C may protrude further than first semiconductor layer SLC1 in a width direction of the light emitting element LD_C by a specific size DIFF. Light characteristics of the light emitting element LD_C may be changed on a protruding portion of the second semiconductor layer SCL2_C. For example, referring to analysis on light characteristics of the light emitting element LD_C using a scanning electron microscope (SEM), it can be checked that undesired yellow luminance is caused through the protruding portion of the second semiconductor layer SCL2_C. In other words, light characteristics of the light emitting element LD_C may deteriorate due to the protruding portion of the second semiconductor layer SCL2_C.

Furthermore, due to the protruding portion of the second semiconductor layer SCL2_C, a portion of the insulating film INF_C that is adjacent to the second semiconductor layer SCL2_C may be thinner than another portion thereof (e.g., a portion adjacent to the first semiconductor layer SCL1). For example, the insulating film INF_C may be formed by forming an insulating layer to cover the stack and removing a portion of the insulating layer that is located on an upper surface of the stack to expose the electrode layer ETL_C. During a process of removing the insulating layer, the insulating layer on the protruding portion of the second semiconductor layer SCL2_C may be over-etched, whereby the thickness of the insulating film INF_C (the portion of the insulating film INF_C that is adjacent to the second semiconductor layer SCL2_C) may be reduced. In the case where the insulating film INF_C has a relatively small thickness, the insulating film INF_C around the second semiconductor layer SCL2 and/or the emission area EML (refer to FIG. 2) may be removed by over-etching which may occur during another subsequent process {e.g., a pixel process for forming a pixel (refer to FIG. 24) using the light emitting element LD}. A short circuit on the light emitting element LD_C may be caused by the second semiconductor layer SCL2 and the emission layer EML that are exposed.

Referring to FIGS. 1 to 3 and 5, because the second semiconductor layer SCL2 and the first semiconductor SCL1 (and the emission layer EML therebetween) of the light emitting element LD has the same diameter (or width), deterioration in light characteristics due to the protruding portion of the second semiconductor layer SCL2_C of FIG. 4 can be prevented from occurring. In other words, the light characteristics of the light emitting element LD may be enhanced.

Furthermore, because the second semiconductor layer SCL2 and the first semiconductor SCL1 (and the emission layer EML therebetween) of the light emitting element LD has the same diameter (or width), the insulating film INF may have a uniform thickness in the overall area thereof enclosing the second semiconductor layer SCL2, the emission layer EML, and the first semiconductor layer SCL1. Because the electrode layer ETL partially covers the insulating film INF, the insulating film INF may be prevented from being removed during a subsequent process, and the second semiconductor layer SCL2 and the emission layer EML may be prevented from being exposed. Therefore, a short circuit on the light emitting element LD can be prevented from occurring.

As illustrated in FIG. 5, the electrode layer ETL may have a bottle cap shape and/or may include the protrusion PRT, so that the electrode layer ETL may have a relatively large (wide) surface area (or contact area). Therefore, in the case where the electrode ETL is connected to an electrode or line (e.g., an electrode or line for applying a driving power voltage and/or a signal), the electrode layer ETL may be more reliably connected to the electrode or the line by a relatively large contact area.

FIGS. 6 to 9 are sectional views respectively schematically illustrating different embodiments of the light emitting element LD of FIG. 1. For example, FIGS. 6 to 9 illustrate different modifications of the embodiment of FIG. 2 with regard to a cross-section of the light emitting element LD corresponding to line I-I' of FIG. 1.

Referring to FIGS. 1 to 9, except the shape of the electrode layer ETL, the light emitting element LD of FIGS. 6 to 9 may be substantially the same as the light emitting element LD described with reference to FIGS. 1 to 3; therefore, redundant explanation thereof will be omitted.

Figure 6:
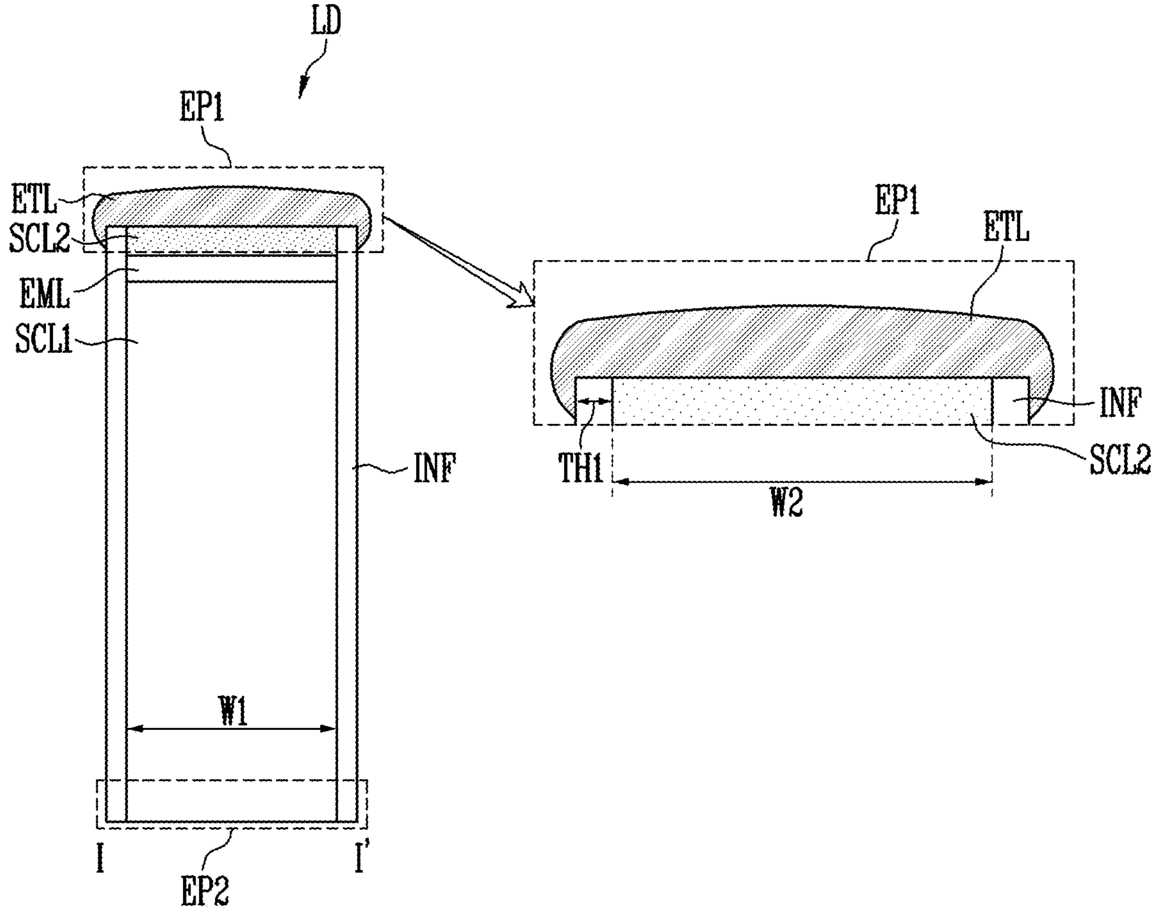
FIGS. 6 to 9 are sectional views respectively schematically illustrating different embodiments of the light emitting element of FIG. 1.

As illustrated in FIG. 6, the electrode layer ETL may partially cover the insulating film INF on the first end EP1 of the light emitting element LD. In other words, the electrode layer ETL may partially cover a side surface of the insulating film INF that is adjacent to the upper surface of the insulating film INF. In a plan view, the diameter (or the surface area) of the electrode layer ETL may be greater than the diameter of the second semiconductor layer SCL2, and may also be greater than the diameter of the insulating film INF. The electrode layer ELT may overlap the insulating film INF in the width direction of the light emitting element LD, and may also overlap the second semiconductor layer SCL2. In an embodiment, the electrode layer ETL may or may not overlap the emission layer EML. For example, in the case where etching time for the electrode layer ETL is reduced, the electrode layer ETL may be formed to partially cover the insulating film INF.

In an embodiment, the electrode layer ETL may have an elliptical cross-sectional shape. Based on (relative to) the upper surface of the second semiconductor layer SCL2 (based on the insulating film INF), the side surface of the electrode layer ETL may have an inclination angle of about 90° or less, or may have a tapered (or forward tapered) cross-sectional shape.

Figure 7:
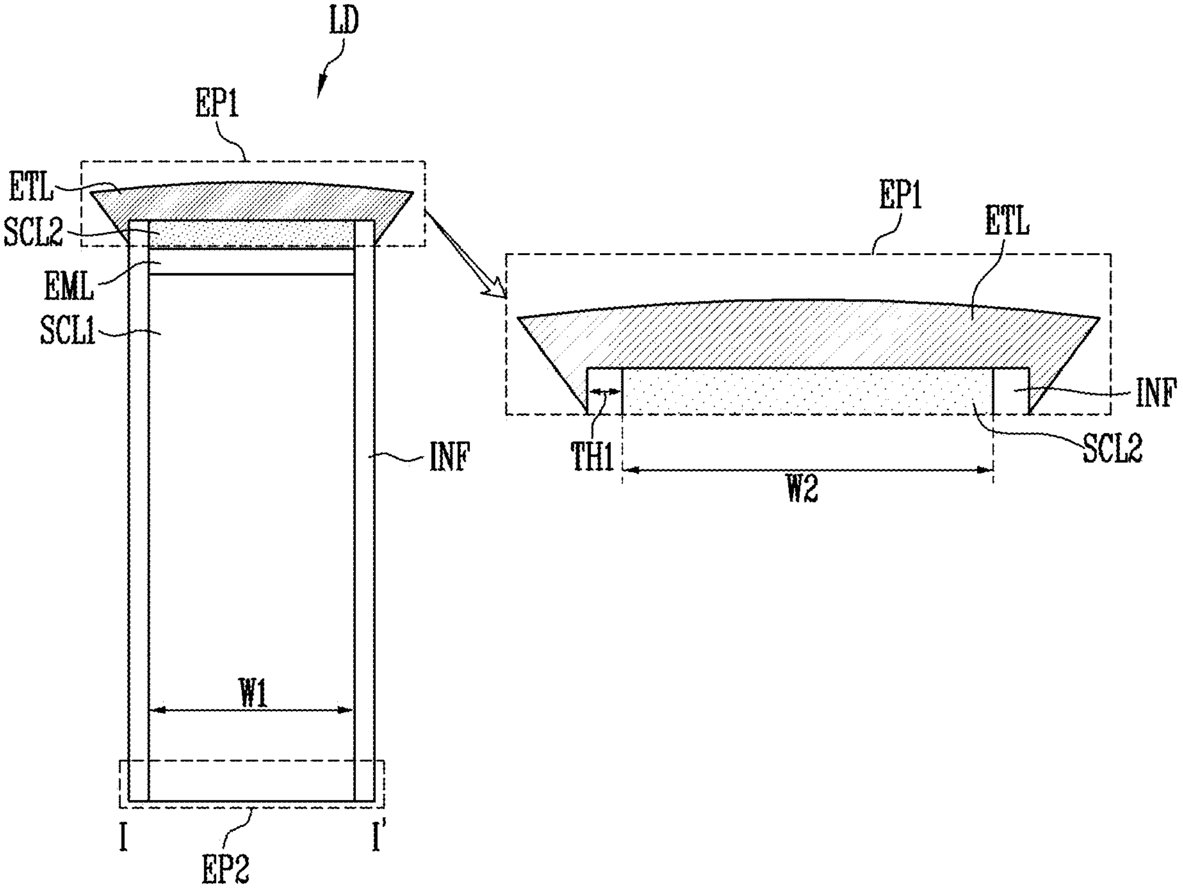

In an embodiment, the electrode layer ETL may have a reversed trapezoidal cross-sectional shape. In other words, the electrode layer ETL may have a reversed tapered cross-sectional shape. As illustrated in FIG. 7, based on the upper surface of the second semiconductor layer SCL2, the side surface of the electrode layer ETL may have an inclination angle of about 90° or more. For example, in the case where a heat treatment process is performed on the electrode layer ETL, an upper portion of the electrode layer ETL that is exposed to the outside and thus directly heat-treated may not be relatively etched, and a lower portion of the electrode layer ETL may be relatively rapidly etched. In other words, the etch rate of the heat-treated electrode layer ETL may vary depending on positions, so that the electrode layer ETL may have a reversed tapered cross-sectional shape.

Figure 8:
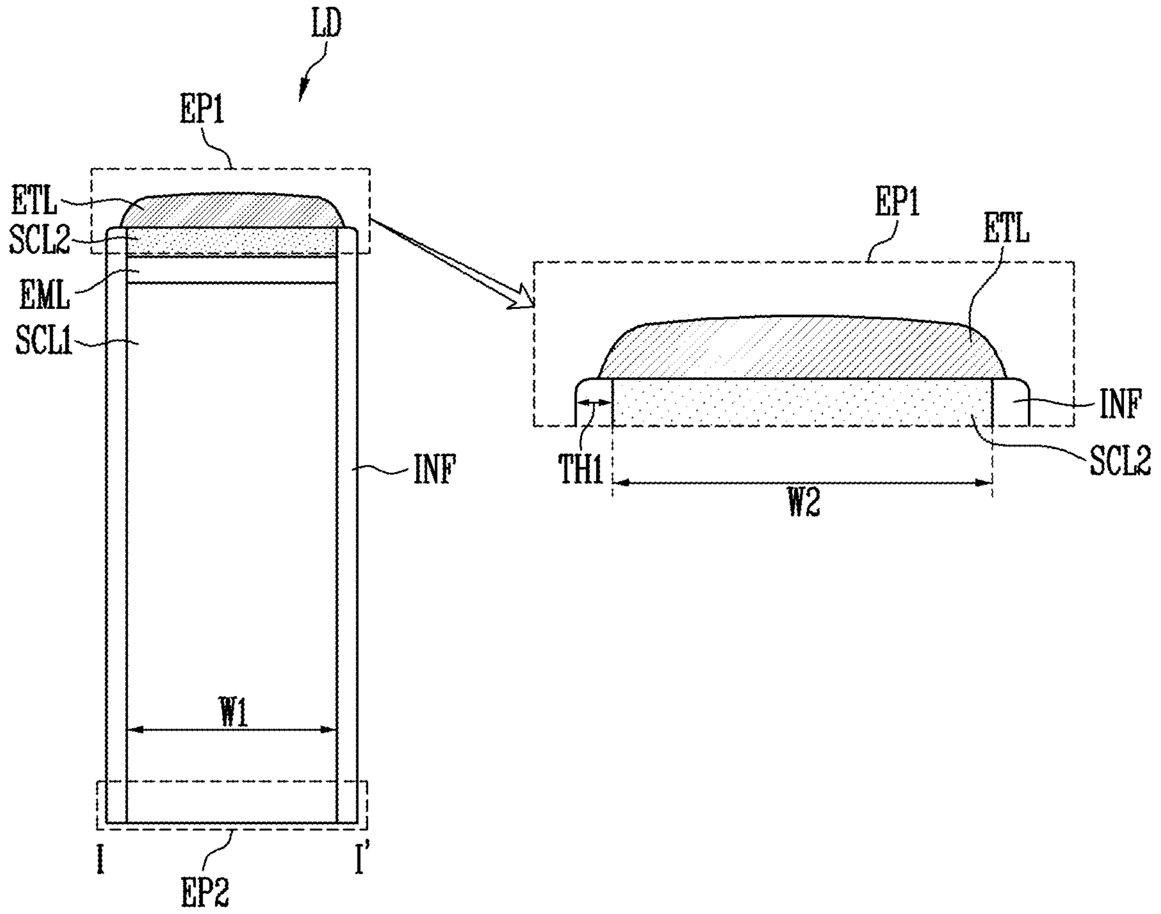

As illustrated in FIG. 8, the electrode layer ETL may partially cover the insulating film INF on the first end EP1 of the light emitting element LD. In other words, the electrode layer ETL may partially cover a portion of the upper surface of the insulating film INF and allow another portion of the upper surface of the insulating film INF to be exposed. On the boundary between the electrode layer ETL and the insulating film INF, the diameter of the electrode layer ETL may be greater than the diameter of the second semiconductor layer SCL2, and may be less than the diameter of the insulating film INF. For example, in the case where etching time for the electrode layer ETL is increased, the electrode layer ETL may be formed to allow the insulating film INF to be partially exposed.

In an embodiment, the electrode layer ETL may have a semi-circular or semi-elliptical cross-sectional shape. Based on the upper surface of the second semiconductor layer SCL2 (based on the insulating film INF), the side surface of the electrode layer ETL may have an inclination angle of about 90° or less, or may have a tapered cross-sectional shape.

Figure 9:
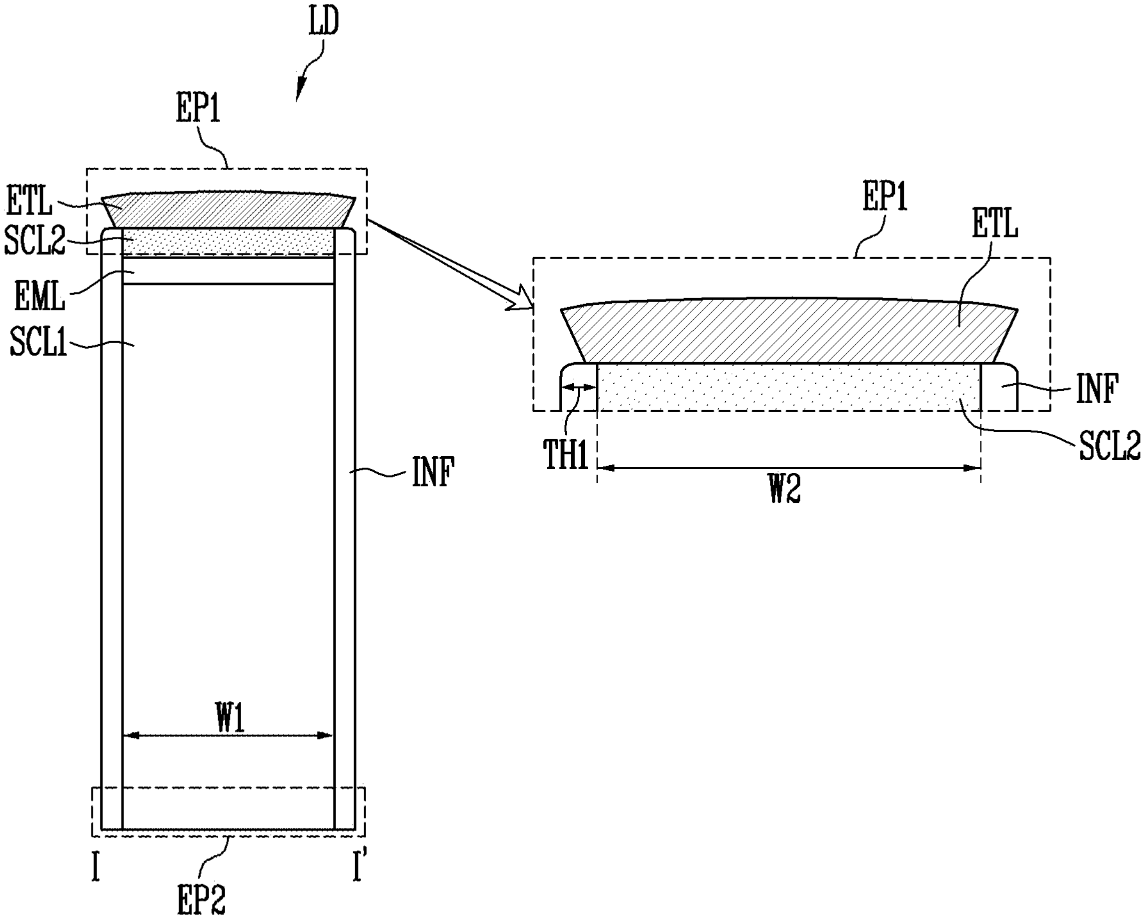

In an embodiment, the electrode layer ETL may have a reversed tapered cross-sectional shape. As illustrated in FIG. 9, based on the upper surface of the second semiconductor layer SCL2, the side surface of the electrode layer ETL may have an inclination of about 90° or more. For example, in the case where a heat treatment process is performed on the electrode layer ETL, the electrode layer ETL may have a reversed tapered cross-sectional shape. The diameter of the upper surface of the electrode layer ETL may be greater than or identical to the diameter of the insulating film INF, but the disclosure is not limited thereto.

As described above, the electrode layer ETL may have various shapes within a range in which the electrode layer ETL can at least partially cover the upper surface of the insulating film INF.

FIGS. 10 to 18 are schematic sectional views each illustrating a method of fabricating a light emitting element in accordance with embodiments. For example, FIGS. 10 to 18 sequentially illustrate a method of fabricating a light emitting element LD in accordance with an embodiment of FIGS. 1 and 2. The light emitting element LD in accordance with embodiments of the FIGS. 6 to 9 may be fabricated by a fabrication method substantially identical or similar to that of the light emitting element LD in accordance with an embodiment of FIGS. 1 and 2. FIGS. 10 to 18 illustrate an embodiment in which multiple light emitting elements LD are fabricated on a single substrate SB.

Figure 10:
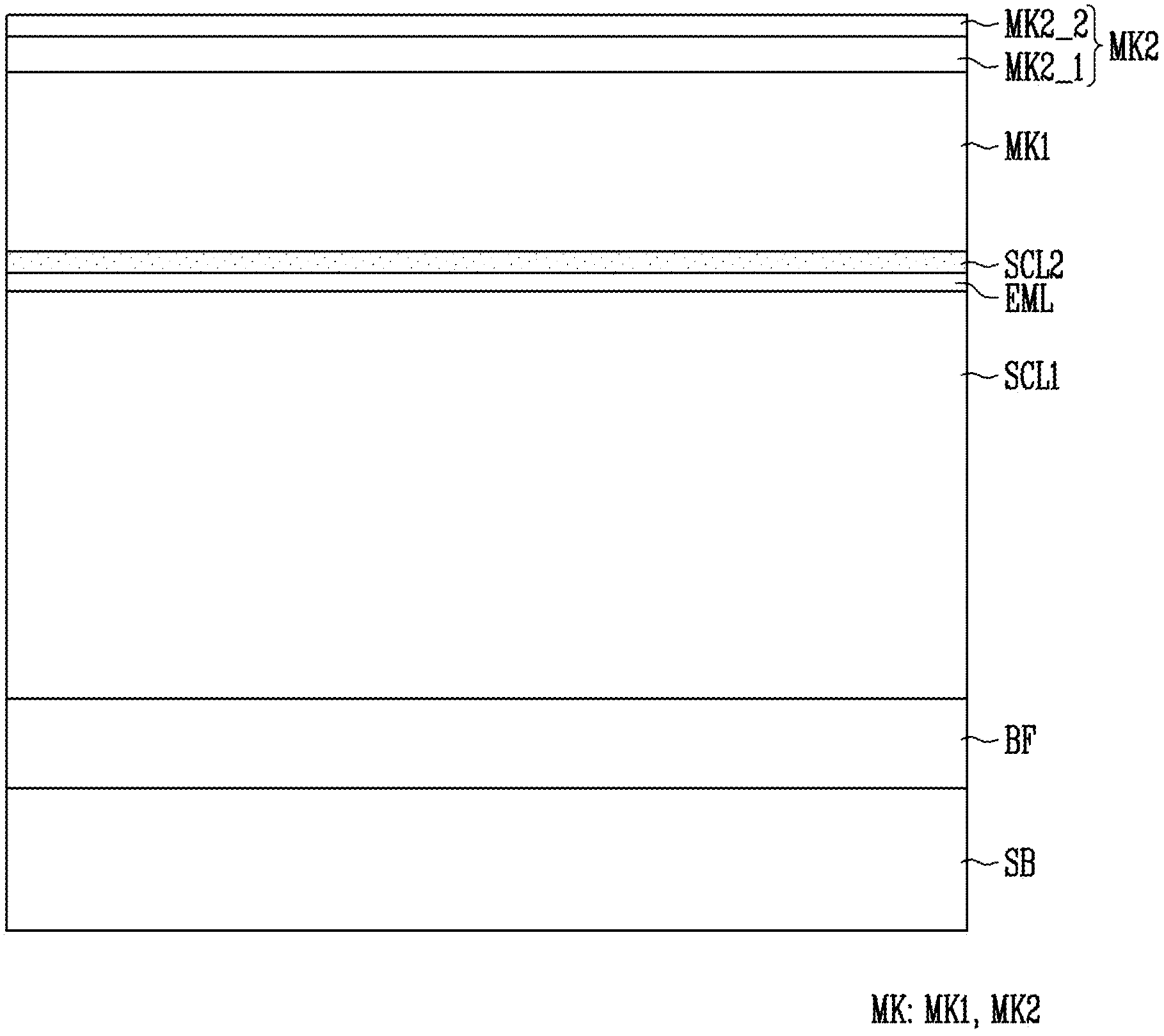
FIGS. 10 to 18 are sectional views each schematically illustrating a method of fabricating a light emitting element in accordance with embodiments.

Referring to FIG. 10, the substrate SB (also referred to as "growth substrate" or "fabrication substrate") may be prepared.

The substrate SB may be a substrate, a wafer, and/or the like suitable for epitaxial growth (epitaxy) of a substrate. For example, the substrate SB may be a substrate including material such as silicon (Si), sapphire, SIC, GaN, GaAs, and/or ZnO. The substrate SB may be formed in various types and/or made of various materials. For example, in the case where epitaxial growth for fabricating the light emitting element LD can be smoothly performed, the type or material of the substrate SB is not limited thereto. After the substrate SB is used as a substrate for epitaxial growth for fabricating the light emitting elements LD, the substrate SB may be eventually separated from the light emitting elements LD.

In an embodiment, a buffer layer BF may be formed on the substrate SB. The buffer layer BF may be formed through epitaxial growth on the substrate SB, and may be eventually separated from the light emitting elements LD. The buffer layer BF may be disposed between the light emitting elements LD and the substrate SB during a process of fabricating the light emitting elements LD so that the light emitting elements LD can be physically spaced apart from the substrate SB. In an embodiment, the buffer layer BF may include an intrinsic semiconductor layer, which is not doped with an impurity, and may include the same semiconductor material as that of a first semiconductor layer SCL1. In an embodiment, the buffer layer BF may include multiple semiconductor layers. One of the multiple semiconductor layers may be an intrinsic semiconductor layer. Another one of the multiple semiconductor layers may be a doped semiconductor layer including a first or second conductive dopant, and may relieve strain between the substrate SB and the first semiconductor layer SCL1.

Thereafter, the first semiconductor layer SCL1, an emission layer EML, and a second semiconductor layer SCL2 may be successively formed on the substrate SB. For example, the first semiconductor layer SCL1, the emission layer EML, and the second semiconductor layer SCL2 may be successively formed through epitaxial growth on the substrate SB on which the buffer layer BF is formed.

The first semiconductor layer SCL1 may be formed of the material of the first semiconductor layer SCL1 discussed herein in an embodiment of FIGS. 1 and 2, or may be formed of other semiconductor materials. The first semiconductor layer SCL1 may be doped with an N-type dopant such as Si, Ge, and/or Sn.

The first semiconductor layer SCL1 may be formed through epitaxial growth using a processing technique such as metal-organic vapor phase epitaxy (MOVPE), metal-organic chemical vapor deposition (MOCVD), molecular beam epitaxy (MBE), liquid phase epitaxy (LPE) or vapor phase epitaxy (VPE), but the method of forming the first semiconductor layer SCL1 is not limited thereto.

The emission layer EML may be formed of the material of the emission layer EML discussed herein in an embodiment of FIGS. 1 and 2, or may be formed of other semiconductor materials. In an embodiment, the emission layer EML may be formed through epitaxial growth using a processing technique such as MOVPE, MOCVD, MBE, LPE or VPE, but the method of forming the emission layer EML is not limited thereto.

The second semiconductor layer SCL2 may be formed of material of the second semiconductor layer SCL2 discussed herein in an embodiment of FIGS. 1 and 2, or may be formed of other semiconductor materials. The second semiconductor layer SCL2 may be doped with a P-type dopant such as Mg. In an embodiment, the second semiconductor layer SCL2 may be formed through epitaxial growth using a processing technique such as MOVPE, MOCVD, MBE, LPE or VPE, but the method of forming the second semiconductor layer SCL2 is not limited thereto.

Referring to FIGS. 10 to 13, a multilayer stack LES (also referred to as "emission stack" or "emission core") including the first semiconductor layer SCL1, the emission layer EML, and the second semiconductor layer SCL2 may be patterned in a rod shape by etching the first semiconductor layer SCL1, the emission layer EML, and the second semiconductor layer SCL2 in a vertical direction substantially perpendicular to the substrate SB. Consequently, a light emitting element LD having a rod shape may be fabricated.

In an embodiment, the light emitting element LD may be patterned by a patterning process using a nano-imprint lithography processing technique, a photolithography processing technique, and/or the like. For example, the light emitting element LD may be patterned by a nano-imprint lithography processing technique.

Figure 11:
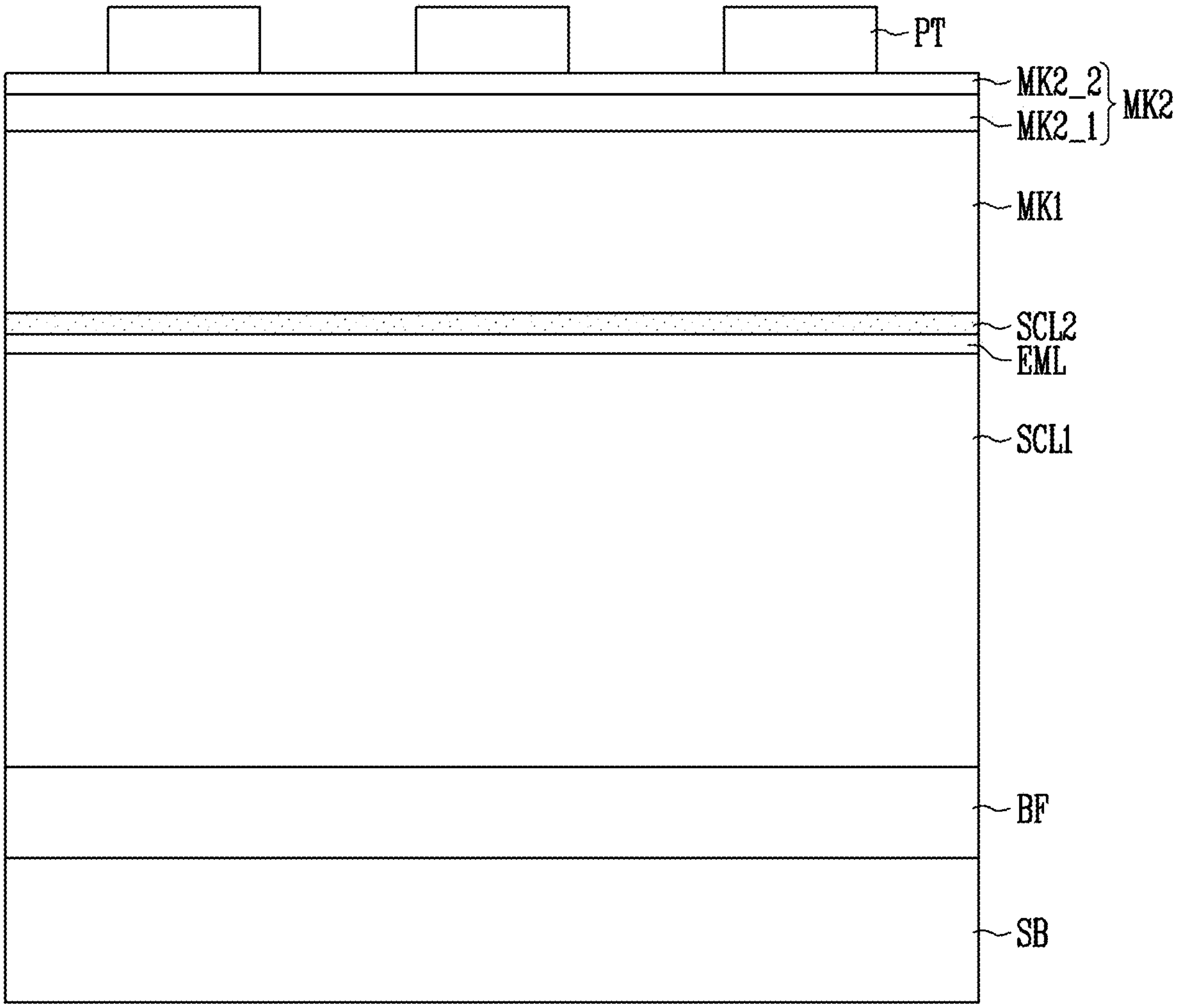
Figure 12:
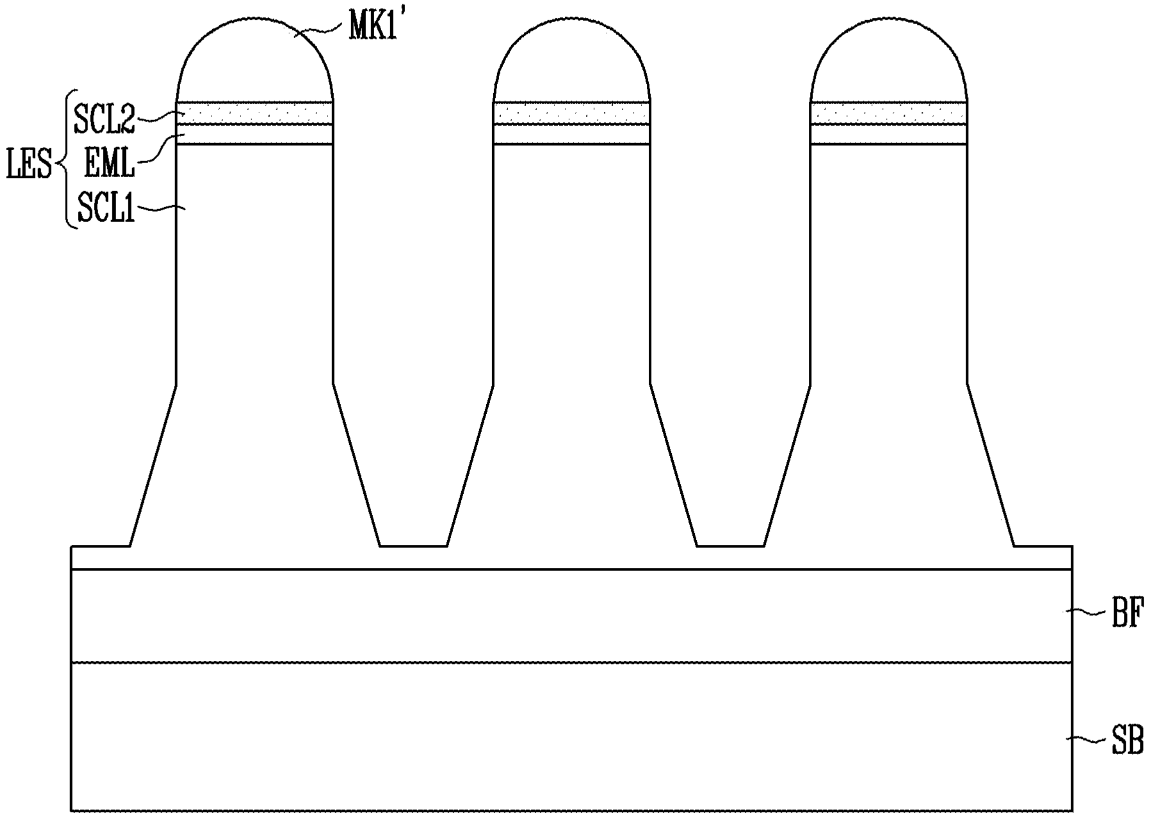
Figure 13:
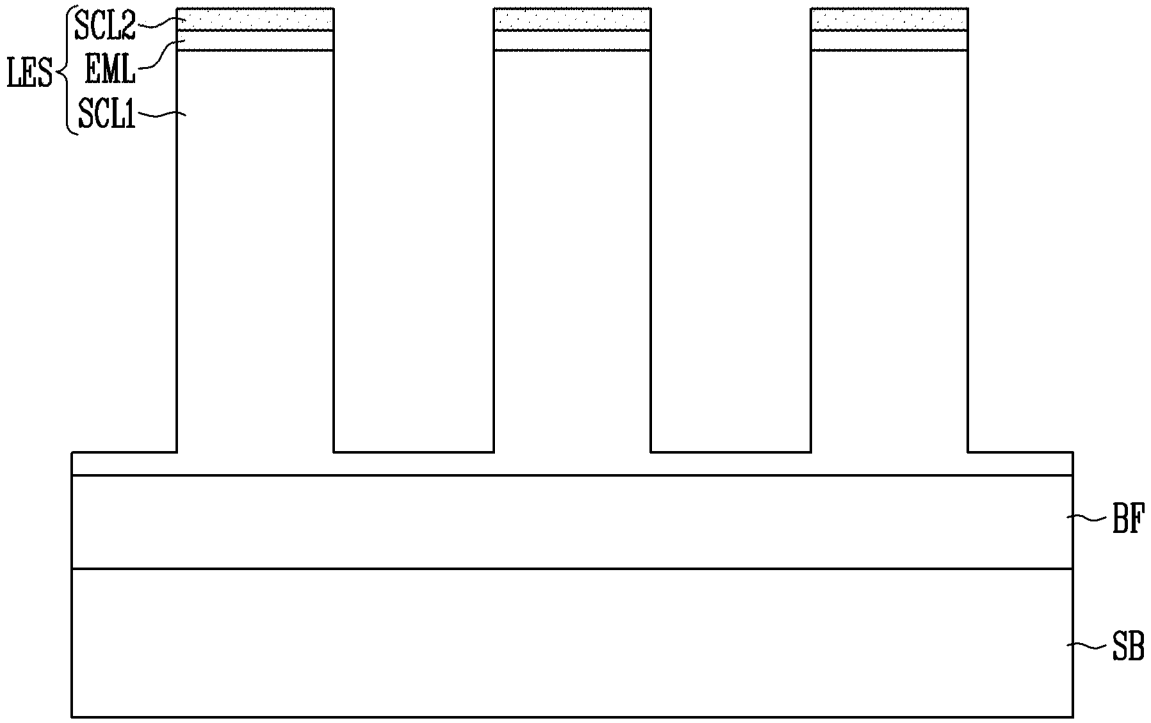

For example, as illustrated in FIG. 10, after a mask layer MK is formed on the second semiconductor layer SCL2, etching patterns PT (e.g., nano-patterns) may be formed on the mask layer MK, as illustrated in FIG. 11. Thereafter, the stack LES including the first semiconductor layer SCL1, the emission layer EML, and the second semiconductor layer SCL2 may be etched in a desired shape such as a rod shape through an etching process using the mask layer MK and the etching patterns PT. For example, the first semiconductor layer SCL1, the emission layer EML, and the second semiconductor layer SCL2 may be etched in the vertical direction through a dry etching process using the mask layer MK and the etching patterns PT, whereby as illustrated in FIG. 12 the stack LES including the first semiconductor layer SCL1, the emission layer EML, and the second semiconductor layer SCL2 may be etched in an approximately rod shape. Thereafter, an additional etching process (e.g., a wet etching process) may be performed, so that as illustrated in FIG. 13 each stack LES that has been primarily etched may be patterned in a rod shape.

In an embodiment, the mask layer MK may include at least two mask layers formed of different materials to enable a selective dry etching process to be performed by layers and/or film types during a subsequent process. For example, a first mask layer MK1 (e.g., a first hard mask layer) including insulating material may be first formed on the second semiconductor layer SCL2, and thereafter a second mask layer MK2 (e.g., a second hard mask layer) including conductive material may be formed on the first mask layer MK1.

The first mask layer MK1 may include silicon oxide ($SiO_x$, e.g., $SiO_2$), silicon nitride ($SiN_x$), silicon oxynitride ($SiO_xN_y$), or other insulating material.

The second mask layer MK2 may include at least one metal of aluminum (Al), titanium (Ti), and chrome (Cr), or other metals. In an embodiment, the second mask layer MK2 may include multiple metal layers MK2_1 and MK2_2 including different metals. For example, the second mask layer MK2 may include a first metal layer MK2_1 including titanium (Ti), and a second metal layer MK2_2 including aluminum (Al). The material and the stacked structure of the second mask layer MK2 are not particularly limited. For example, any material may be used as the material of the second mask layer MK2 so long as it can perform a function of a mask for successively etching the first semiconductor layer SCL1, the emission layer EML, and the second semiconductor layer SCL2. Furthermore, the second mask layer MK2 may have a single-layer structure or a multi-layer structure. As the second mask layer MK2 is formed, the first mask layer MK1 may be protected by the second mask layer MK2 in case that the etching patterns PT are removed during a subsequent process.

The etching patterns PT may be disposed at positions spaced apart from each other on the mask layer MK. The etching patterns PT may be formed to have a shape, a size, and/or an interval corresponding to those of the light emitting elements LD so that the light emitting elements LD can be patterned on the substrate SB. For example, the etching patterns PT each may have a shape and a size corresponding to the shape and the diameter D of each light emitting element LD, and may be spaced apart from each other by a distance sufficient to readily separate the light emitting elements LD from each other.

The etching patterns PT may include polymer or other materials. In an embodiment, the etching patterns PT may include nano-imprint resin, and may be formed using a nano-imprint lithography processing technique.

In an embodiment, the first semiconductor layer SCL1, the emission layer EML, and the second semiconductor layer SCL2 may be primarily etched through a phased dray etching process using the etching patterns PT. For example, after the second mask layer MK2 is etched using the etching patterns PT, the first mask layer MK1 may be etched. Furthermore, after the first mask layer MK1 is etched, the second semiconductor layer SCL2, the emission layer EML, and the first semiconductor layer SCL1 may be successively etched. In an embodiment, the second semiconductor layer SCL2, the emission layer EML, and the first semiconductor layer SCL1 may be etched in substantially the vertical direction through a dry etching process, and thus have an approximately rod shape, as illustrated in FIG. 12. A first mask pattern MK1' that is formed by etching the first mask layer MK1 in a pattern corresponding to the etching patterns PT may remain on the second semiconductor layer SCL2 even after the dry etching process for the second semiconductor layer SCL2, the emission layer EML, and the first semiconductor layer SCL1 has been completed.

Thereafter, an additional etching process such as a wet etching process may be performed so that the stack LES including the first semiconductor layer SCL1, the emission layer EML, and the second semiconductor layer SCL2 may be etched in a rod shape.

The mask layer MK, the etching patterns PT, and/or the first mask patterns MK1' may be removed after each etching process using the mask layer MK, the etching patterns PT, and/or the first mask patterns MK1' has been completed.

Because the etching process for the first semiconductor layer SCL1, the emission layer EML, and the second semiconductor layer SCL2 is performed before the electrode layer ETL is disposed on the second semiconductor layer SCL2, the diameter (or the width) of the stack LES may be uniform in the overall area. In other words, the second semiconductor layer SCL2 and the first semiconductor layer SCL1 (and the emission layer EML therebetween) of the stack LES may have the same diameter (or width).

Figure 14:
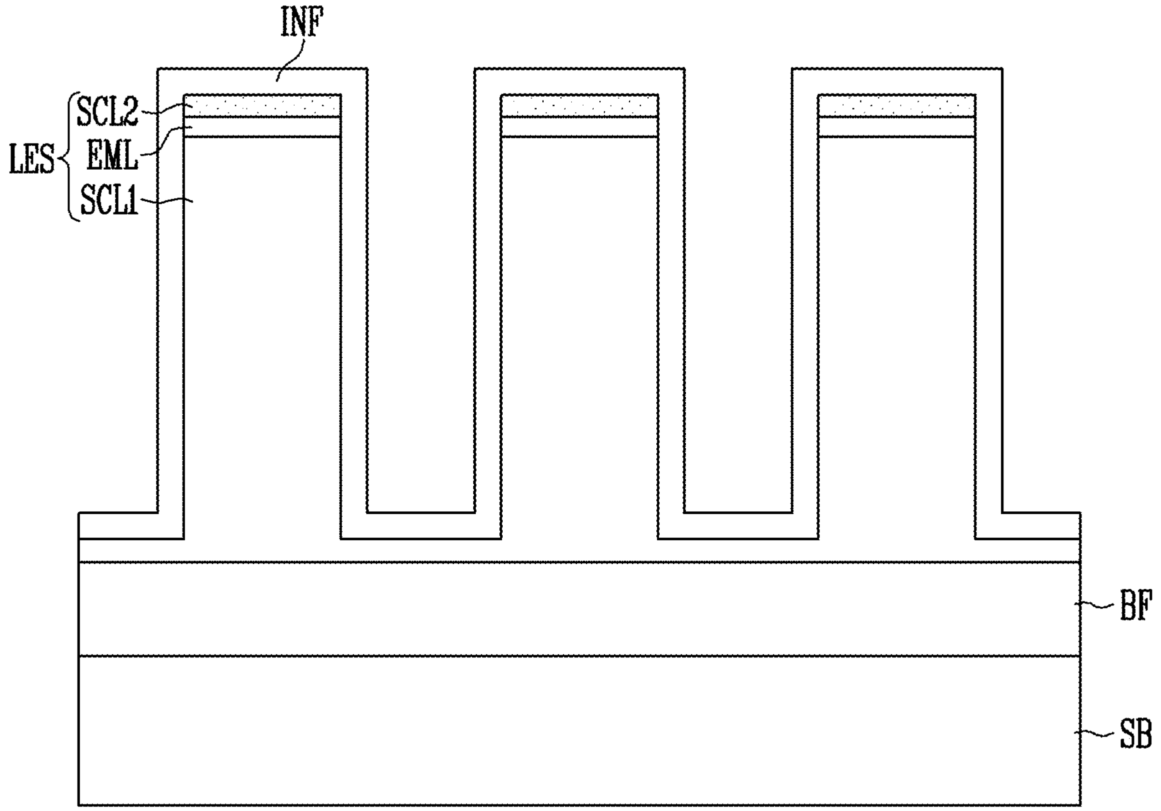

Referring to FIG. 14, the insulating film INF may be formed on an overall area of a surface (e.g., an upper surface) of the substrate SB including the stacks LES each having a rod shape. The insulating film INF may have a uniform thickness from surfaces of the stacks LES. In an embodiment, the insulating film INF may be formed of the same material as that of the insulating film INF discussed herein in an embodiment of FIGS. 1 and 2, or other insulating materials. In an embodiment, the insulating film INF may be formed by the ALD processing technique, the CVD processing technique, and/or the like, but the method of the insulating film INF is not limited thereto.

Figure 15:
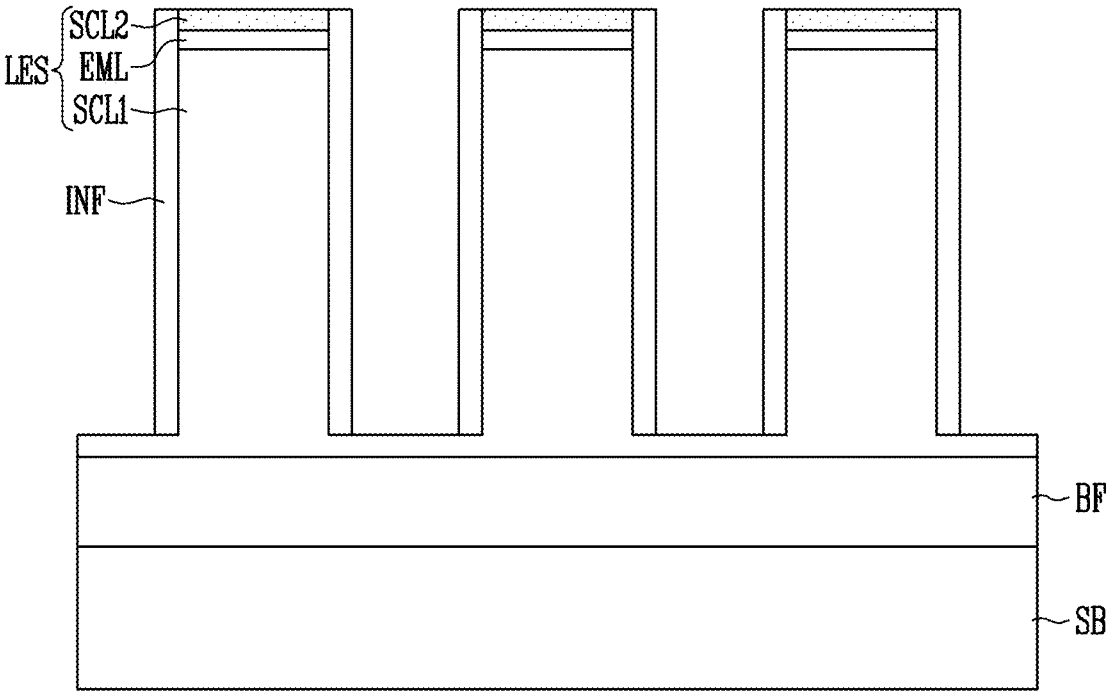

Referring to FIG. 15, the insulating film INF may be etched so that the upper surface of the second semiconductor layer SCL2 is exposed. Consequently, the insulating film INF may be formed on the side surface of each of the rod-shaped stacks LES (e.g., the side surfaces of the first semiconductor layer SCL1, the emission layer EML, and the second semiconductor layer SCL2), and the second semiconductor layer SCL2 may be exposed on the upper surface of each of the stacks LES.

Because the diameter (or width) of the stack LES is uniform in the overall area, the insulating film INF may be uniformly etched in the overall area or may not be etched, so that the insulating film INF may have or maintain a uniform thickness in the overall area enclosing the second semiconductor layer SCL2, the emission layer EML, and the first semiconductor layer SCL1.

Figure 16:
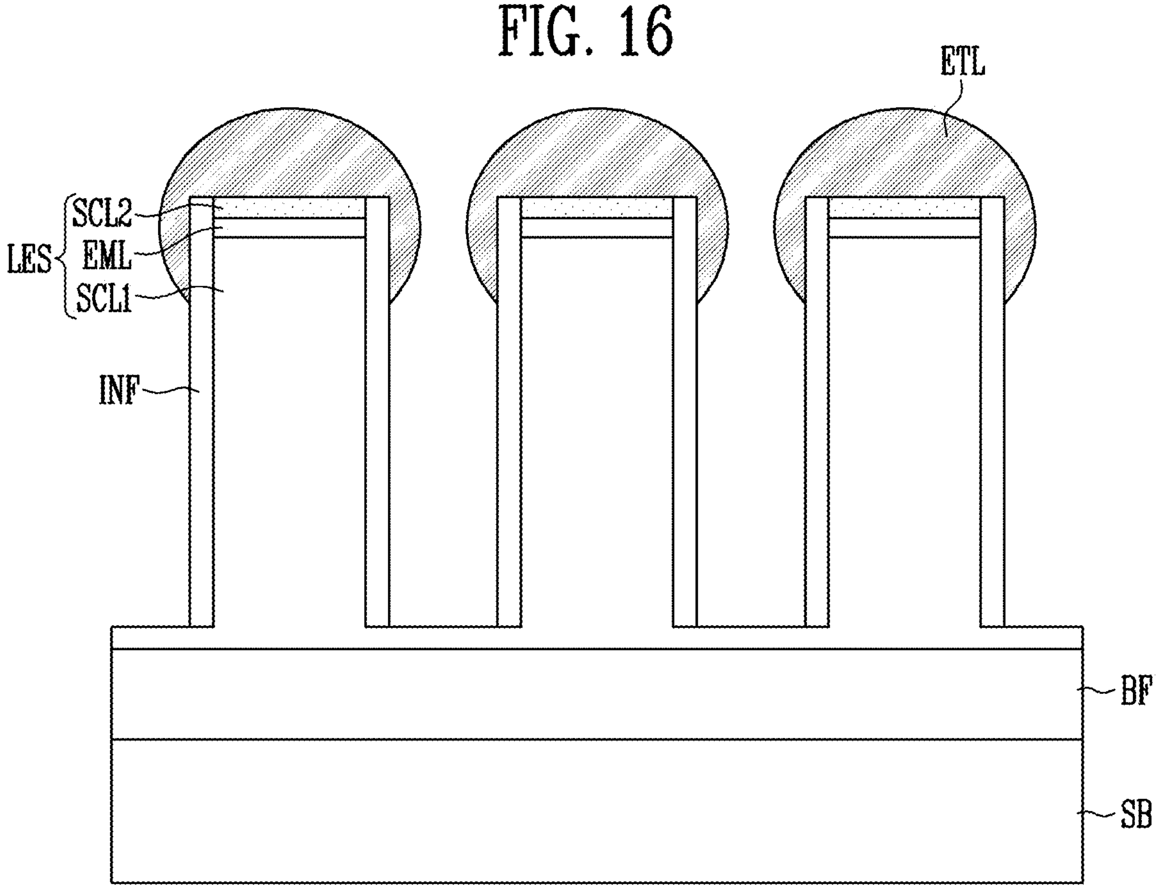
Figure 17:
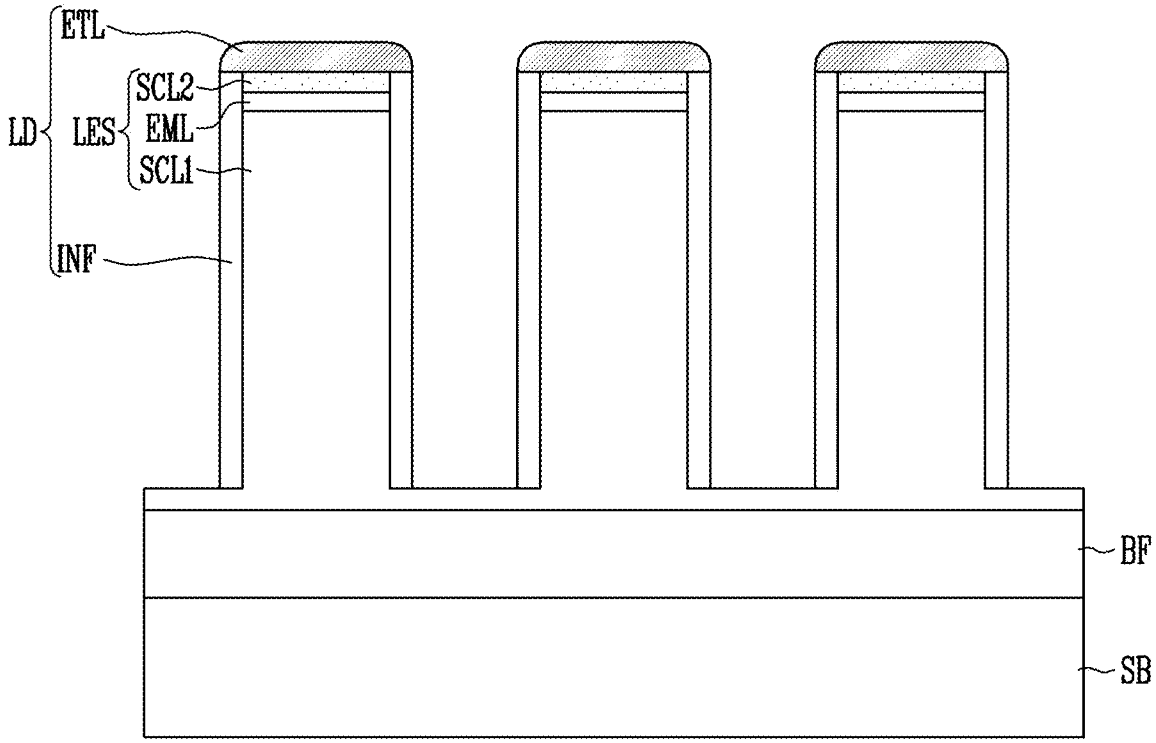

Referring to FIG. 16, an electrode layer ETL may be primarily formed on an upper end of each of the stacks LES each having a rod shape. The electrode layer ETL may be formed through a sputtering processing technique. The electrode layer ETL may be formed to have a spherical shape enclosing the upper end of each of the stacks LES. However, the method of forming the electrode layer ETL is not limited thereto. For example, the electrode layer ETL may be formed using the ALD processing technique, the CVD processing technique, and/or the like. Furthermore, the electrode layer ETL may be formed on the overall area of a surface (e.g., the upper surface) of the substrate SB including the stacks LES. The electrode layer ETL may be formed of the material of the electrode layer ETL discussed herein in an embodiment of FIGS. 1 and 2, or may be formed of other semiconductor materials.

Thereafter, the electrode layer ETL (e.g., a side portion of the electrode ETL) may be etched by a wet etching technique. As illustrated in FIG. 17, the electrode layer ETL may remain on only the upper surfaces of the second semiconductor layer SCL2 and the insulating film INF. Particularly, in the case where the electrode layer ETL having a spherical shape is processed by dry-etching, the electrode layer ETL may have a bottle cap shape (or profile) described with reference to FIG. 3. The electrode layers ETL having various shapes shown in FIGS. 6 to 9 may be formed by adjusting the etching time and/or the like for the electrode layer ETL.

Figure 18:
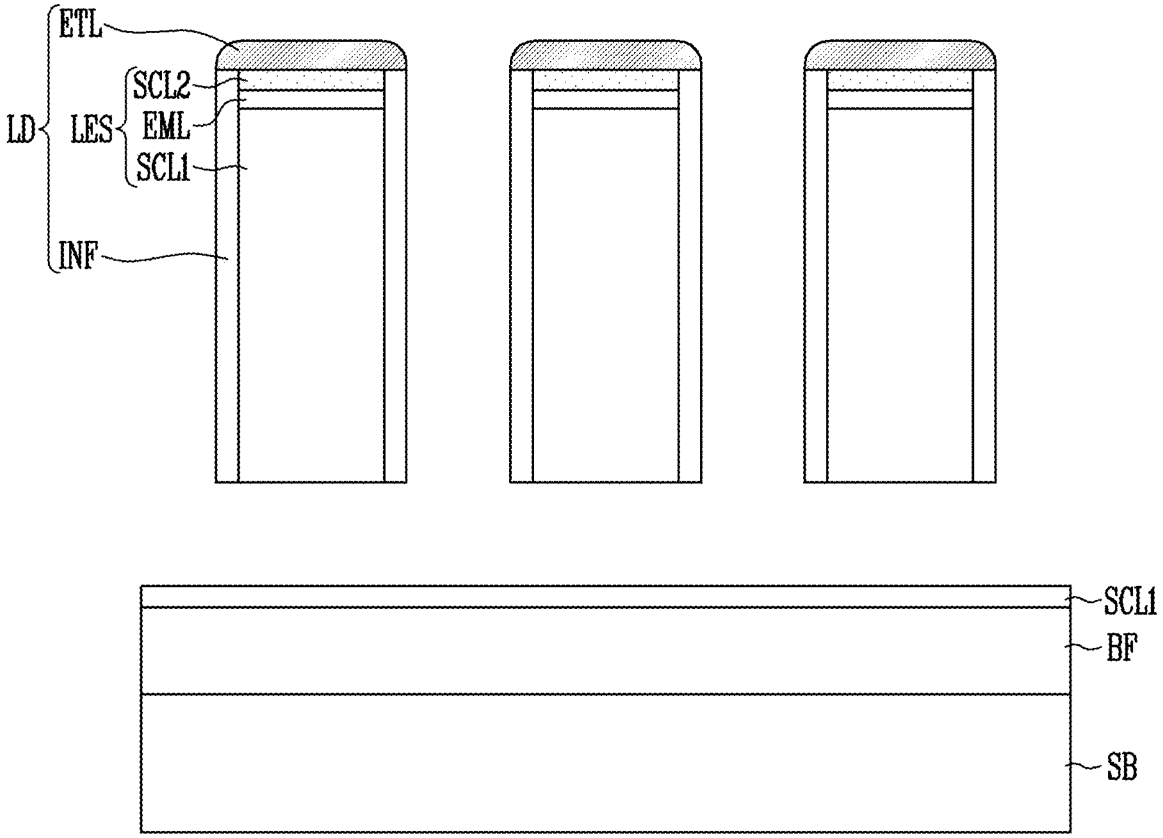

Referring to FIG. 18, the light emitting elements LD may be separated from the substrate SB. In an embodiment, the light emitting elements LD may be separated from the substrate SB by an electrical and/or chemical etching scheme, or other schemes.

In the above-mentioned way, each light emitting element LD including the stack LES, the insulating film INF provided on the side surface of the stack LES, and the electrode layer ETL which covers the upper surfaces of the stack LES and the insulating film INF may be fabricated.

Figure 19:
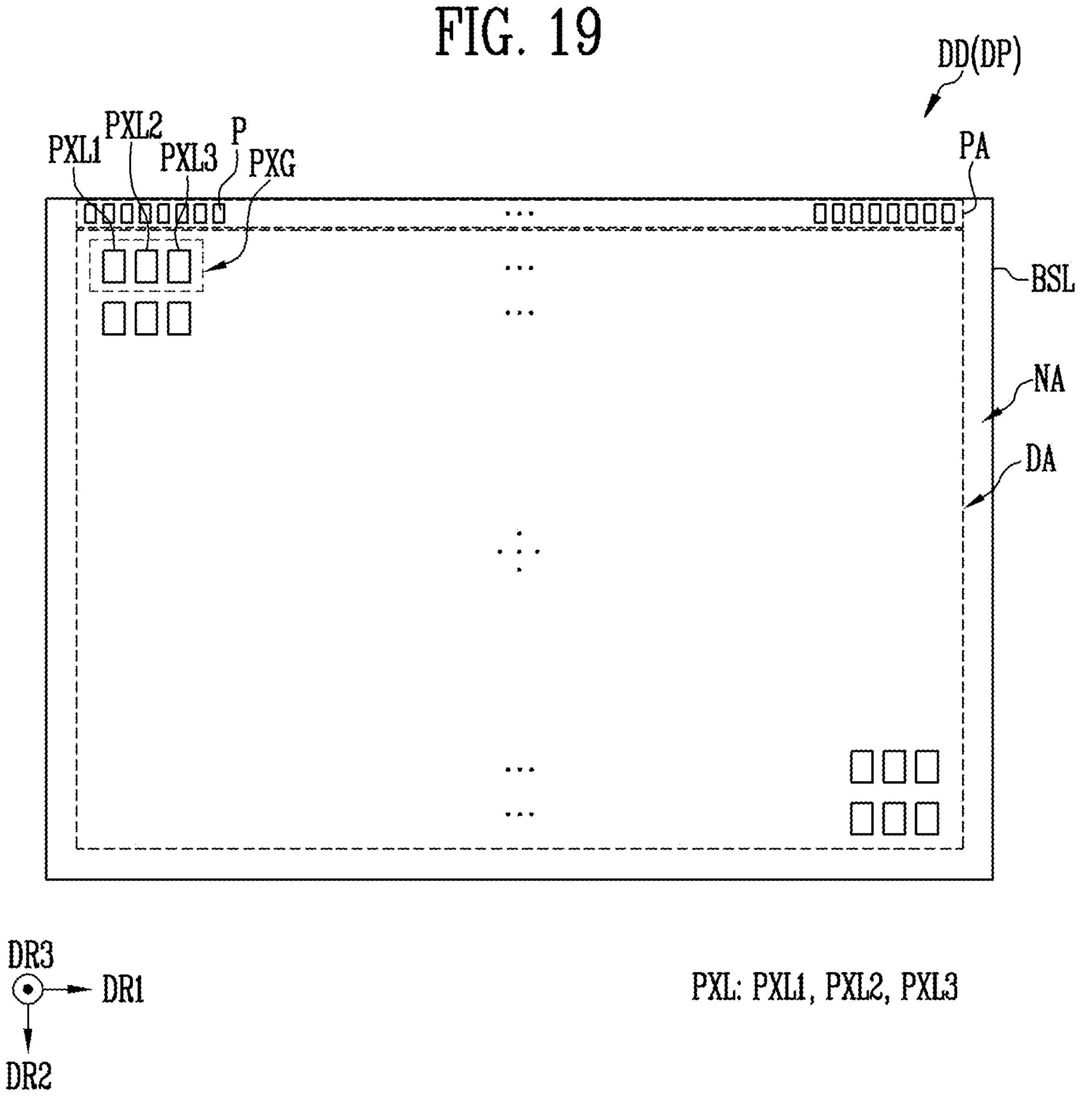
FIG. 19 is a plan view schematically illustrating a display device in accordance with embodiments.

FIG. 19 is a plan view schematically illustrating a display device DD in accordance with embodiments. FIG. 19 schematically illustrates the structure of the display device DD, centered on a display panel DP including a display area DA. The display device DD may further include a driving circuit (e.g., a scan driver, a data driver) for driving the pixels PXL.

Referring to FIG. 19, the display device DD may include a base layer BSL, and pixels PXL disposed on the base layer BSL. The base layer BSL and the display device DD including the base layer BSL may be provided in various shapes. For example, the base layer BSL and the display device DD each may be provided in the form of a substantially rectangular plate, in a plan view, and may include an angled or round corner. The shape of each of the base layer BSL and the display device DD may be changed. For example, the base layer BSL and the display device DD each may have a polygonal shape such as a hexagonal or octagonal shape, in a plan view, or may have a shape such as a circular shape or an elliptical shape, including a curved perimeter.

In FIG. 19, there is illustrated the case where the display device DD is provided in the form of a rectangular plate. Furthermore, a longitudinal direction (e.g., a row direction or a horizontal direction) of the display device DD is defined as a first direction DR1. A transverse direction (e.g., a column direction or a vertical direction) of the display device DD is defined as a second direction DR2. A thickness direction (or a height direction) of the display device DD is defined as a third direction DR3.

The base layer BSL may be a base component for forming the display device DD. For example, the base layer BSL may form a base surface of the display device DD.

The base layer BSL and the display device DD including the base layer BSL may include a display area DA for displaying an image, and a non-display area NA located around the display area DA.

The display area DA may be an area in which the pixels PXL are disposed, and may be an area in which an image is displayed by pixels PXL. In an embodiment, the display area DA may be disposed in a central area of the base layer BSL, i.e., a central area of the display device DD, (e.g., a central area of the display panel DP).

The display area DA may have various shapes. For example, the display area DA may have various shapes including a rectangular shape, a circular shape, an elliptical shape, and the like. In an embodiment, the display area DA may have a shape corresponding to that of the base layer BSL, but the disclosure is not limited thereto.

The non-display area NA may be a remaining area other than the display area DA. In an embodiment, the non-display area NA may be disposed in a peripheral area of the base layer BSL, i.e., a peripheral area of the display device DD, so as to enclose the display area DA. A portion of the non-display area NA may be a pad area PA in which pads P are disposed.

The pixels PXL may be disposed in the display area DA. For example, the display area DA may include multiple pixel areas on which the respective pixels PXL are provided and/or disposed.

In an embodiment, at least two kinds of pixels PXL configured to emit different colors of light may be disposed on the display area DA. For example, first color pixels PXL1, second color pixels PXL2, and third color pixels PXL3 may be arranged in the display area DA. At least one first color pixel PXL1, at least one second color pixel PXL2, and at least one third color pixel PXL3 that are disposed adjacent to each other may form one pixel group PXG. The color of light emitted from the pixel group PXG may be changed in various ways by individually controlling luminances of the first-color, second-color, and third-color pixels PXL1, PXL2, and PXL3.

In an embodiment, the first-color pixel PXL1, the second-color pixel PXL2, and the third-color pixel PXL3 that are successively arranged in the first direction DR1 may form one pixel group PXG. The number, type, mutual disposition structure, and/or the like of pixels PXL that form each pixel group PXG may be changed in various ways.

In an embodiment, the first-color pixel PXL1 may be a red pixel configured to emit red light, and the second-color pixel PXL2 may be a green pixel configured to emit green light. Furthermore, the third-color pixel PXL3 may be a blue pixel configured to emit blue light. The color of light emitted from the pixels PXL that form each pixel group PXG may be changed in various ways.

In an embodiment, each pixel PXL may include at least one light emitting element LD. For example, the pixel PXL may include a light emitting element LD in accordance with at least one embodiment among the embodiments of FIGS. 1 to 9. In an embodiment, each light emitting element LD may have a size ranging from approximately the nanometer to approximately the micrometer, and may have a rod shape, but the disclosure is not limited thereto. For example, the number, type, structure, size, and/or the like of light emitting elements LD provided in each pixel PXL may be changed depending on embodiments.

In an embodiment, the first-color pixel PXL1, the second-color pixel PXL2, and the third-color pixel PXL3 may respectively include first, second, and third colors of light emitting elements LD as light sources. Hence, the first-color pixel PXL1, the second-color pixel PXL2, and the third-color pixel PXL3 may respectively emit a first color of light, a second color of light, and a third color of light.

In an embodiment, the first-color pixel PXL1, the second-color pixel PXL2, and the third-color pixel PXL3 may include light emitting elements LD configured to emit the same color of light. A light conversion layer including wavelength conversion particles (e.g., particles such as quantum dot QD which may convert the color and/or wavelength of light) may be disposed in the emission area of each of the first-color pixel PXL1, the second-color pixel PXL2, and the third-color pixel PXL3. Consequently, the first-color pixel PXL1, the second-color pixel PXL2, and the third-color pixel PXL3 may respectively emit a first color of light, a second color of light, and a third color of light.

For example, the first-color pixel PXL1, the second-color pixel PXL2, and the third-color pixel PXL3 may include blue light emitting elements. A light conversion layer including first color wavelength conversion particles (e.g., red quantum dots) may be disposed in the emission area of the first-color pixel PXL1. A light conversion layer including second color wavelength conversion particles (e.g., green quantum dots) may be disposed in the emission area of the second-color pixel PXL2. Hence, the first color pixel PXL1 may emit a first color of light (e.g., red light). The second pixel PXL2 may emit a second color of light (e.g., green light).

The pixels PXL may have a structure according to one of embodiments to be described below. For example, the pixels PXL each may have a structure to which any one embodiment of the embodiments to be described below is applied or a combination of at least two embodiments thereof is applied.

In an embodiment, the pixel PXL may be formed of an active pixel, but the disclosure is not limited thereto. For example, in an embodiment, the pixel PXL may be formed of a passive pixel.

Lines and/or internal circuit components which are connected to the pixels PXL of the display area DA may be disposed in the non-display area NA. Furthermore, a portion of the non-display area NA may be set to the pad area PA. The pads P may be disposed in the pad area PA. The pads P may include signal pads and/or power pads to which various driving signals and/or power voltages needed to drive the pixels PXL are applied.

In an embodiment, the non-display area NA may have a relatively small width. For example, the non-display area NA may have a width of approximately 100 μm or less. Hence, the display device DD may be implemented as a bezel-less display device.

Figure 20:
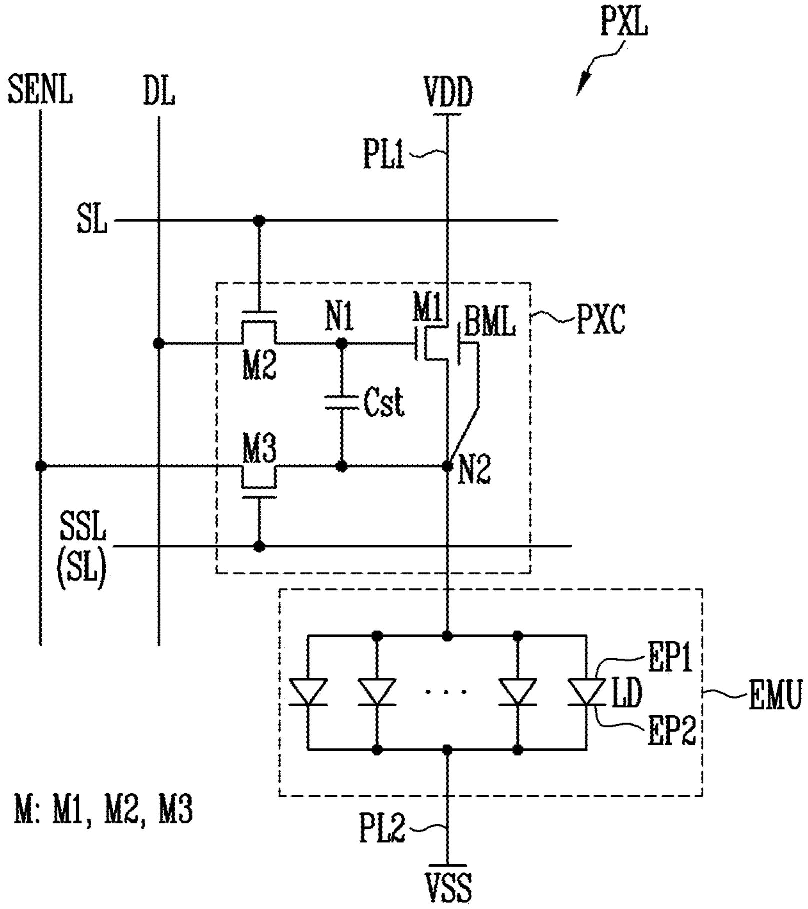
FIGS. 20 and 21 are circuit diagrams each schematically illustrating an embodiment of a pixel included in the display device of FIG. 19.
Figure 21:
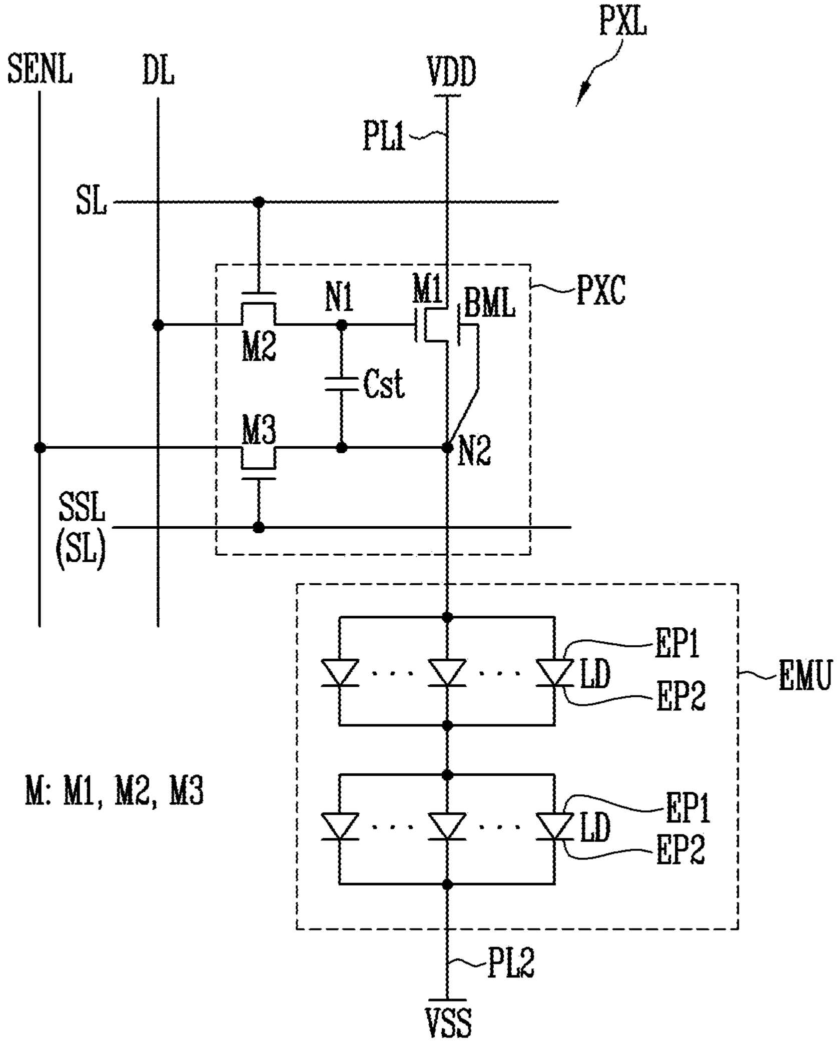

FIGS. 20 and 21 are circuit diagrams each schematically illustrating an embodiment of a pixel included in the display device of FIG. 19. For example, FIGS. 20 and 21 illustrate pixels PXL including emission components EMU having different structures.

In an embodiment, each pixel PXL illustrated in FIGS. 20 and 21 may be any one of the pixels PXL disposed in the display area DA of FIG. 19. The pixels PXL may have structures substantially identical or similar to each other.

Referring to FIGS. 20 and 21, the pixel PXL may be connected to a scan line SL (also referred to as "first scan line"), a data line DL, a first power line PL1, and a second power line PL2. Furthermore, the pixel PXL may be further connected to at least one other power line and/or signal line. For example, the pixel PXL may be further connected to a sensing line SENL (also referred to as "initialization power line") and/or a control line SSL (also referred to as "second scan line").

The pixel PXL may include an emission component EMU configured to emit light having a luminance corresponding to each data signal. Furthermore, the pixel PXL may further include a pixel circuit PXC configured to drive the emission component EMU.

The pixel circuit PXC may be connected to the scan line SL and the data line DL, and may be connected between the first power line PL1 and the emission component EMU. For example, the pixel circuit PXC may be connected to the scan line SL to which a first scan signal may be supplied, the data line DL to which a data signal may be supplied, the first power line PL1 to which a voltage of a first power supply VDD may be applied, and the emission component EMU.

The pixel circuit PXC may be selectively further connected to the control line SSL to which a second scan signal may be supplied, and the sensing line SENL which is connected to a reference power supply (or an initialization power supply) or a sensing circuit in response to a display period or a sensing period. In an embodiment, the second scan signal may be a signal identical to or different from the first scan signal. In the case where the second scan signal is the same signal as the first scan signal, the control line SSL may be integrated with the scan line SL.

The pixel circuit PXC may include at least one transistor M and at least one capacitor Cst. For example, the pixel circuit PXC may include a first transistor M1, a second transistor M2, a third transistor M3, and a capacitor Cst.

The first transistor M1 may be connected between the first power line PL1 and a second node N2. The second node N2 may be a node to which the pixel circuit PXC and the emission component EMU are connected. For example, the second node N2 may be a node by which one electrode (e.g., a source electrode) of the first transistor M1 is electrically connected to the emission component EMU. A gate electrode of the first transistor M1 may be connected to a first node N1. The first transistor M1 may control driving current to be supplied to the emission component EMU in response to a voltage of the first node N1. For example, the first transistor M1 may be a driving transistor of the pixel PXL.

In an embodiment, the first transistor M1 may further include a bottom metal layer BML (also referred to as "back gate electrode" or "second gate electrode"). In an embodiment, the bottom metal layer BML may be connected to one electrode (e.g., a source electrode) of the first transistor M1.

An embodiment in which the first transistor M1 includes the bottom metal layer BML may employ a back-biasing technique (or a sync technique) of shifting a threshold voltage of the first transistor M1 in a negative direction or a positive direction by applying a back-biasing voltage to the bottom metal layer BML of the first transistor M1. Furthermore, in the case where the bottom metal layer BML is disposed under a semiconductor pattern (e.g., a semiconductor pattern SCP of FIG. 23) that forms a channel of the first transistor M1, operating characteristics of the first transistor M1 may be stabilized by blocking light from being incident on the semiconductor pattern.

The second transistor M2 may be connected between the data line DL and the first node N1. A gate electrode of the second transistor M2 may be connected to the scan line SL. in case that a scan signal having a gate-on voltage (e.g., a logic high voltage or a high level voltage) is supplied from the scan line SL, the second transistor M2 may be turned on to connect the data line DL with the first node N1.

During each frame period, a data signal of the corresponding frame may be supplied to the data line DL, and the data signal may be transmitted to the first node N1 through the second transistor M2 during a period during which the first scan signal having a gate-on voltage is supplied. For example, the second transistor M2 may be a switching transistor configured to transmit each data signal to the interior of the pixel PXL.

A first electrode of the capacitor Cst may be connected to the first node N1. A second electrode of the capacitor Cst may be connected to the second node N2. The capacitor Cst may be charged with a voltage corresponding to a data signal to be supplied to the first node N1 during each frame period.

The third transistor M3 may be connected between the second node N2 and the sensing line SENL. A gate electrode of the third transistor M3 may be connected to the control line SSL (or the scan line SL). In case that a second scan signal (or a first scan signal) having a gate-on voltage (e.g., a logic high voltage or a high level voltage) is supplied from the control line SSL, the third transistor M3 may be turned on so that a reference voltage (or an initialization voltage) supplied to the sensing line SENL may be transmitted to the second node N2, or the voltage of the second node N2 may be transmitted to the sensing line SENL. In an embodiment, the voltage of the second node N2 may be transmitted to the sensing circuit through the sensing line SENL, and may be provided to the driving circuit (e.g., a timing controller) and used to compensate for a characteristic deviation of the pixels PXL.

Although FIGS. 20 and 21 illustrate that all of the transistors M included in the pixel circuit PXC are formed of N-type transistors, embodiments are not limited thereto. For example, at least one of the first, second, and third transistors M1, M2, and M3 may be changed to a P-type transistor. The structure and driving method of the pixel PXL may be changed in various ways depending on embodiments.

The emission component EMU may include at least one light emitting element LD. In an embodiment, the emission component EMU may include a single light emitting element LD connected in a forward direction between the first power supply VDD and a second power supply VSS. In an embodiment, the emission component EMU may include multiple light emitting elements LD connected in the forward direction between the first power supply VDD and the second power supply VSS. At least one light emitting element LD connected in the forward direction between the first power supply VDD and the second power supply VSS may form a valid light source of the pixel PXL.

In an embodiment, the emission component EMU may include light emitting elements LD connected in parallel to each other between the pixel circuit PXC and the second power line PL2 in the same manner as that of the embodiment of FIG. 20. The first ends EP1 of the light emitting elements LD may be electrically connected to the pixel circuit PXC, and may be electrically connected to the first power line PL1 through the pixel circuit PXC. The second ends EP2 of the light emitting elements LD may be electrically connected to the second power line PL2. A voltage of the second power supply VSS may be applied to the second power line PL2.

The number, type, and/or structure of light emitting elements LD that form a valid light source of the pixel PXL may be changed depending on embodiments. Furthermore, the arrangement and/or connection structure of the light emitting elements LD may also be changed in various ways depending on embodiments.

In an embodiment, the emission component EMU may include light emitting elements LD connected in series-parallel to each other between the pixel circuit PXC and the second power line PL2 in the same manner as that of the embodiment of FIG. 21. For example, the light emitting elements LD may be arranged in and/or connected to at least two series sets between the pixel circuit PXC and the second power line PL2. Each series set may include at least one light emitting element LD connected in the forward direction between the first power supply VDD and the second power supply VSS.

The first power supply VDD and the second power supply VSS may have different potentials. For example, the first power supply VDD may be a high-potential power supply, and the second power supply VSS may be a low-potential power supply. A difference in potential between the first power supply VDD and the second power supply VSS may be equal to or greater than the threshold voltage of the light emitting elements LD.

The light emitting elements LD may emit light at a luminance corresponding to driving current supplied thereto through the pixel circuit PXC. During each frame period, the pixel circuit PXC may supply driving current corresponding to a data signal to the emission component EMU. The driving current supplied to the emission component EMU may flow to the light emitting elements LD and enable the light emitting elements LD to emit light. Hence, the emission component EMU may emit light at a luminance corresponding to the driving current.

Although FIGS. 20 and 21 illustrate only the light emitting elements LD (i.e., valid light sources) that are connected in the forward direction between the first power supply VDD and the second power supply VSS, embodiments are not limited thereto. For example, the emission component EMU may further include at least one invalid light source, as well as including the light emitting elements LD that form the respective valid light sources. For example, the emission component EMU may further include at least one invalid light emitting element which is arranged in a reverse direction between the first power supply VDD and the second power supply VSS, or at least a portion of which floats.

Figure 22:
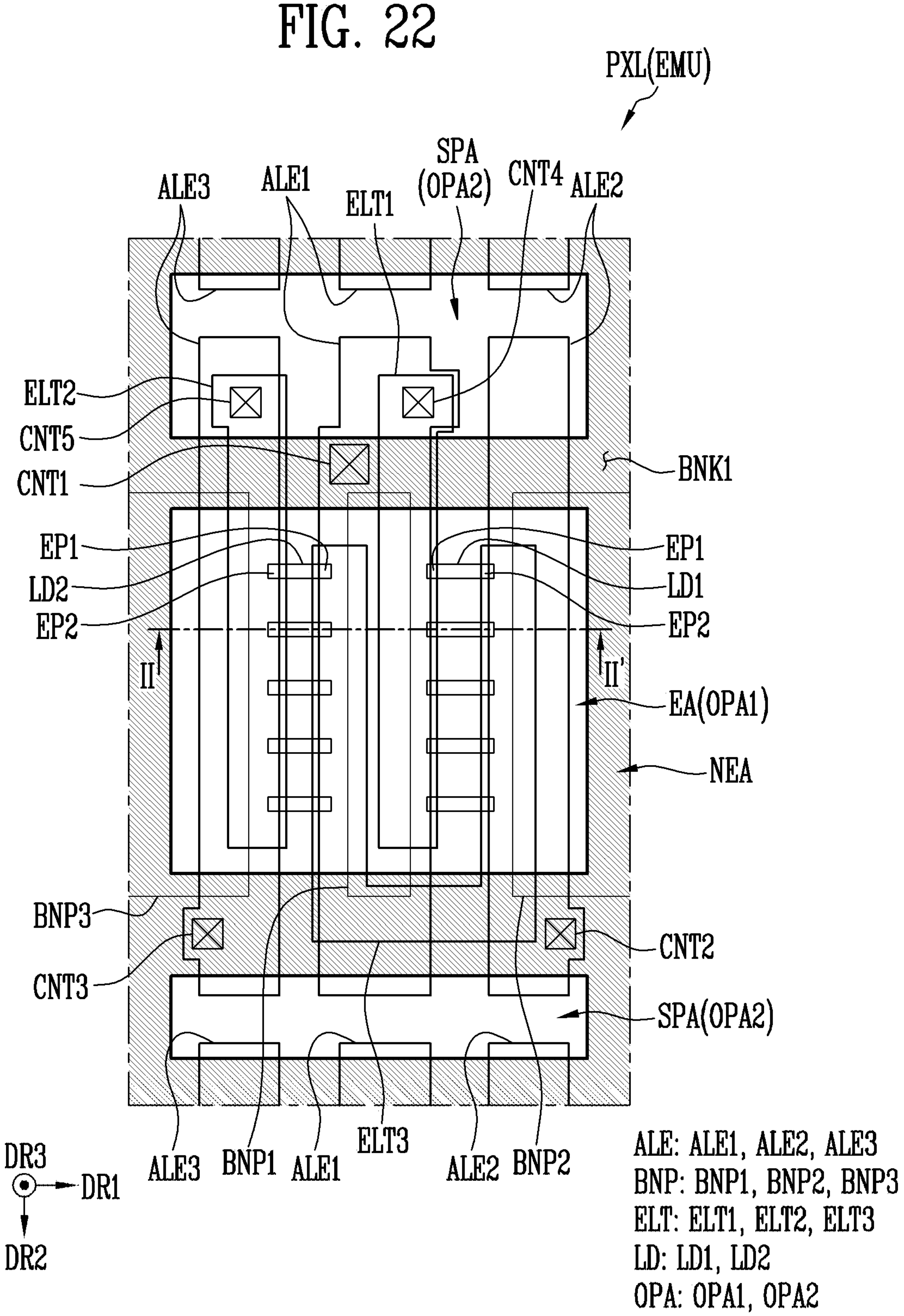
FIG. 22 is a plan view schematically illustrating an embodiment of the pixel of FIG. 21.

FIG. 22 is a plan view schematically illustrating an embodiment of the pixel PXL of FIG. 21. For example, FIG. 22 illustrates the structure of the pixel PXL, centered on the emission component EMU, and illustrates an embodiment of the emission component EMU including light emitting elements LD connected in series-parallel to each other in the same manner as that of the embodiment of FIG. 21.

Referring to FIGS. 1 to 22, the pixel PXL may include an emission area EA in which at least one light emitting element LD is disposed. In an embodiment, the emission area EA may include at least two light emitting elements LD, and electrodes electrically connected to the light emitting elements LD. In an embodiment, the electrodes may include alignment electrodes ALE and pixel electrodes ELT (also referred to as "contact electrodes"). Furthermore, the pixel PXL may further include bank patterns BNP disposed under the alignment electrodes ALE.

The alignment electrodes ALE may have various shapes, and may be spaced apart from each other. In an embodiment, the alignment electrodes ALE may be spaced apart from each other in the first direction DR1, and each may have a shape (e.g., a bar-like shape) extending in the second direction DR2.

The shape, size, number, position, and/or mutual disposition structure of alignment electrodes ALE may be changed in various ways depending on embodiments. Furthermore, the alignment electrodes ALE may have shapes and/or sizes similar or identical to each other, or may have different shapes and sizes.

The alignment electrodes ALE may include at least two electrodes spaced apart from each other. For example, the alignment electrodes ALE may include a first alignment electrode ALE1 and a second alignment electrode ALE2, and may selectively further include a third alignment electrode ALE3.

In an embodiment, the first alignment electrode ALE1 may be located in a center portion of the emission area EA. The second alignment electrode ALE2 and the third alignment electrode ALE3 may be disposed on opposite sides of the first alignment electrode ALE1. For example, the second alignment electrode ALE2 may be disposed on a right side of the first alignment electrode ALE1, and the third alignment electrode ALE3 may be disposed on a left side of the first alignment electrode ALE1.

The alignment electrodes ALE (or alignment lines provided before being divided into the respective alignment electrode ALE of the pixels PXL) may be supplied with alignment signals needed to align light emitting elements LD at the step of aligning the light emitting elements LD. Hence, an electric field may be formed between the alignment electrodes ALE, so that the light emitting elements LD may be aligned and/or arranged between the alignment electrodes ALE. Here, the words "the light emitting elements LD may be aligned and/or arranged between the alignment electrodes ALE" may mean that at least a portion of each of the light emitting elements LD is disposed between the alignment electrodes ALE.

For example, the first alignment electrode ALE1, the second alignment electrode ALE2, and the third alignment electrode ALE3 (or a first alignment line to which the first alignment electrodes ALE1 of the pixels PXL are connected, a second alignment line to which the second alignment electrodes ALE2 of the pixels PXL are connected, and a third alignment line to which the third alignment electrodes ALE3 of the pixels PXL are connected) may be respectively supplied with a first alignment signal, a second alignment signal, and a third alignment signal at the step of aligning the light emitting elements LD. The first alignment signal and the second alignment signal may have different waveforms, different potentials, and/or different phases. Hence, an electric field may be formed between the first alignment electrode ALE1 and the second alignment electrode ALE2, so that light emitting elements LD (e.g., first light emitting elements LD1) may be aligned between the first alignment electrode ALE1 and the second alignment electrode ALE2. The first alignment signal and the third alignment signal may have different waveforms, different potentials, and/or different phases. An electric field may be formed between the first alignment electrode ALE1 and the third alignment electrode ALE3, so that light emitting elements LD (e.g., second light emitting elements LD2) may be aligned between the first alignment electrode ALE1 and the third alignment electrode ALE3. The third alignment signal may be a signal identical to or different from the second alignment signal.

The alignment electrodes ALE may be disposed in the emission area EA of each pixel PXL. In an embodiment, the alignment electrodes ALE may pass through the non-emission area NEA around the emission area EA and extend to a separation area SPA. The separation area SPA may be an area in which, after alignment of the light emitting elements LD is completed, each alignment line (e.g., the first alignment line, the second alignment line, or the third alignment line) is divided into the alignment electrodes ALE of the pixels PXL (e.g., the first alignment electrodes ALE1, the second first alignment electrodes ALE2, or the third first alignment electrodes ALE3 of the pixels PXL). The separation area SPA may be disposed on at least one side of each emission area EA.

For example, each pixel PXL may include at least one separation area SPA (e.g., two separation areas SPA disposed on upper and lower sides of each emission area EA) which is disposed around the emission area EA. Furthermore, an end of at least one electrode (e.g., ends of the alignment electrodes ALE) that form the emission component EMU may be disposed in each separation area SPA.

In an embodiment, each alignment electrode ALE may have a separate pattern for each corresponding pixel PXL. For example, each of the first, second, and third alignment electrodes ALE1, ALE2, and ALE3 of each of the pixels PXL may have an individual separate pattern.

However, the disclosure is not limited thereto. For example, in a structure in which second pixel electrodes ELT2 of the pixels PXL are connected in common to the second power line PL2, the alignment electrodes ALE connected to the second pixel electrodes ELT2 (e.g., the third alignment electrodes ALE3 of the pixels PXL) may be integrally formed between adjacent pixels PXL in the first direction DR1 and/or the second direction DR2 without being disconnected.

Figure 23:
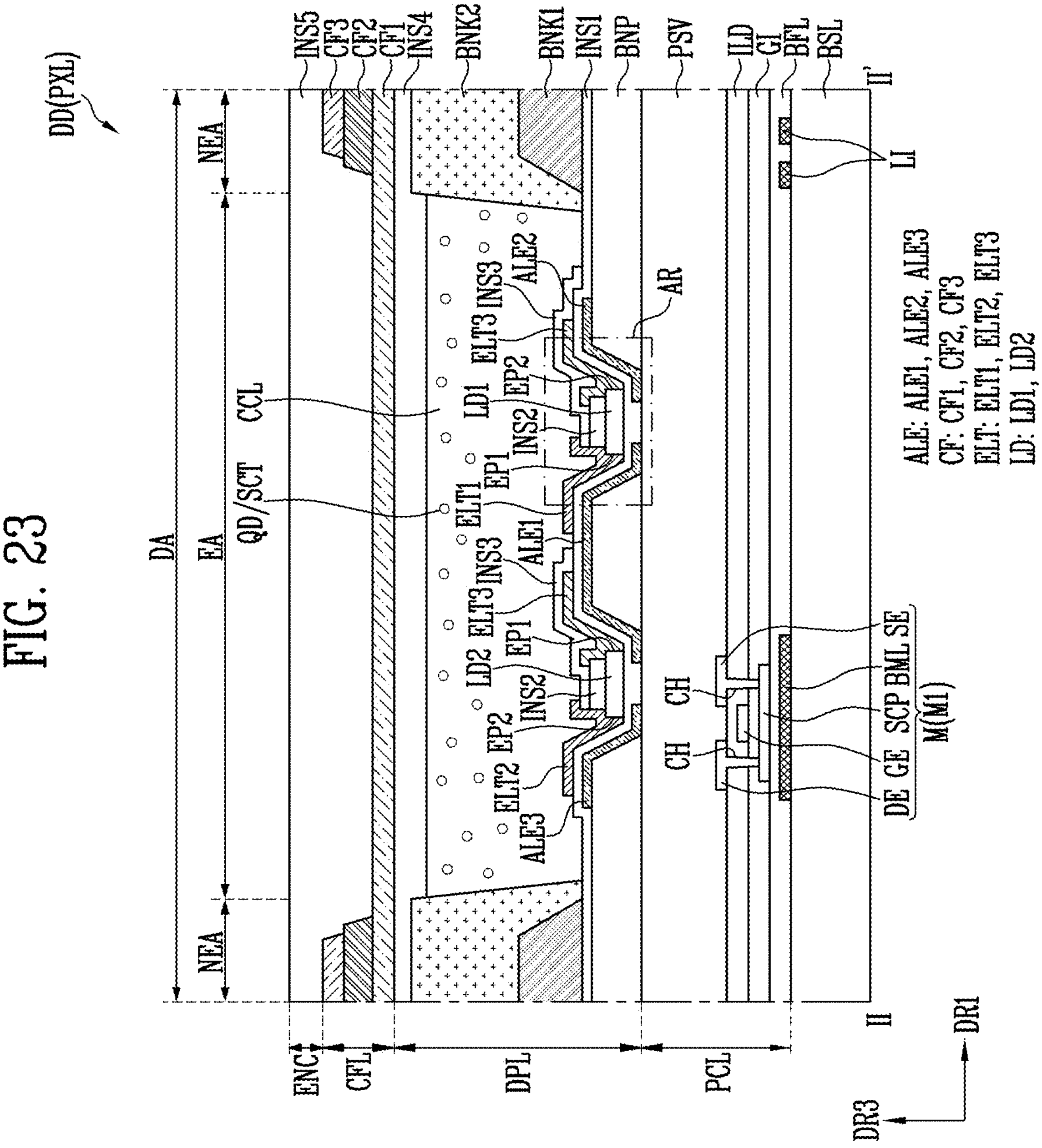
FIG. 23 is a sectional view schematically illustrating an embodiment of the display device of FIG. 19.

In an embodiment, the first alignment electrode ALE1 may be electrically connected, through a first contactor CNT1, to the first power line PL1 and/or the pixel circuit PXC (e.g., the pixel circuit PXC of the corresponding pixel PXL) located in a circuit layer (e.g., a circuit layer PCL of FIG. 23). A first alignment signal may be supplied to the first alignment electrode ALE1 (or the first alignment line) through at least one line (e.g., the first power line PL1) located in the circuit layer.

The first contactor CNT1 may include at least one contact hole and/or via hole. In an embodiment, the first contactor CNT1 may be located in the non-emission area NEA located around each emission area EA, but the location of the first contactor CNT1 may be changed. For example, the first contactor CNT1 may be disposed in each emission area EA or each separation area SPA.

In an embodiment, the second alignment electrode ALE2 may be electrically connected, through a second contactor CNT2, to the second power line PL2 located in the circuit layer. A second alignment signal may be supplied to the second alignment electrode ALE2 (or the second alignment line) through the second power line PL2.

Likewise, the third alignment electrode ALE3 may be electrically connected, through a third contactor CNT3, to the second power line PL2 located in the circuit layer. A second alignment signal may also be supplied to the third alignment electrode ALE3 (or the third alignment line) through the second power line PL2.

Each of the second contactor CNT2 and the third contactor CNT3 may include at least one contact hole and/or via hole. In an embodiment, the second contactor CNT2 and the third contactor CNT3 may be located in the non-emission area NEA located around each emission area EA, but the locations of the second contactor CNT2 and the third contactor CNT3 may be changed. For example, the second contactor CNT2 and the third contactor CNT3 may be disposed in each emission area EA or each separation area SPA.

At least one first light emitting element LD1 may be disposed between the first alignment electrode ALE1 and the second alignment electrode ALE2. For example, multiple first light emitting elements LD1 may be disposed between the first alignment electrode ALE1 and the second alignment electrode ALE2.

Each first light emitting element LD1 may or may not overlap the first alignment electrode ALE1 and/or the second alignment electrode ALE2. The first end EP1 of the first light emitting element LD1 may be disposed adjacent to the first alignment electrode ALE1, and the second end EP2 of the first light emitting element LD1 may be disposed adjacent to the second alignment electrode ALE2.

The first end EP1 of the first light emitting element LD1 may be electrically connected to a first pixel electrode ELT1. In an embodiment, the first end EP1 of the first light emitting element LD1 may be electrically connected to the pixel circuit PXC and/or the first power line PL1 through the first pixel electrode ELT1. For example, the first end EP1 of the first light emitting element LD1 may be electrically connected to the first alignment electrode ALE1 (or a bridge electrode corresponding to the first alignment electrode ALE1) through the first pixel electrode ELT1, and may also be electrically connected to the pixel circuit PXC and/or the first power line PL1 through the first alignment electrode ALE1. The disclosure is not limited thereto.

The second end EP2 of the first light emitting element LD1 may be electrically connected to a third pixel electrode ELT3 and/or the second pixel electrode ELT2. In an embodiment, the second end EP2 of the first light emitting element LD1 may be electrically connected to the third pixel electrode ELT3. Furthermore, the second end EP2 of the first light emitting element LD1 may be electrically connected to the second power line PL2 successively via the third pixel electrode ELT3, at least one second light emitting element LD2, the second pixel electrode ELT2, and the third alignment electrode ALE3.

At least one second light emitting element LD2 may be disposed between the first alignment electrode ALE1 and the third alignment electrode ALE3. For example, multiple second light emitting elements LD2 may be disposed between the first alignment electrode ALE1 and the third alignment electrode ALE3.

Each second light emitting element LD2 may or may not overlap the first alignment electrode ALE1 and/or the third alignment electrode ALE3. The first end EP1 of the second light emitting element LD2 may be disposed adjacent to the first alignment electrode ALE1, and the second end EP2 of the second light emitting element LD2 may be disposed adjacent to the third alignment electrode ALE3.

The first end EP1 of the second light emitting element LD2 may be electrically connected to the third pixel electrode ELT3. The second end EP2 of the second light emitting element LD2 may be electrically connected to the second pixel electrode ELT2. In an embodiment, the second end EP2 of the second light emitting element LD2 may be electrically connected to the second power line PL2 through the second pixel electrode ELT2. For example, the second end EP2 of the second light emitting element LD2 may be electrically connected to the third alignment electrode ALE3 through the second pixel electrode ELT2, and may also be electrically connected to the second power line PL2 through the third alignment electrode ALE3. The disclosure is not limited thereto.

For example, each light emitting element LD (e.g., each first light emitting element LD1 or each second light emitting element LD2) may include the first end EP1 electrically connected to the first pixel electrode ELT1, and the second end EP2 electrically connected to the second pixel electrode ELT2. In an embodiment, each light emitting element LD may be an inorganic light emitting element which is made of material having an inorganic crystal structure and has a subminiature size (e.g., a small size ranging from the nanometer to the micrometer). For example, each light emitting element LD may be a subminiature inorganic light emitting element fabricated by growing a nitride-based semiconductor or a phosphide-based semiconductor. Here, the type, size, shape, structure, and/or number of light emitting elements LD that form each emission component EMU may be changed.

The light emitting elements LD may be dispersed in a solution and prepared in the form of a light-emitting-element mixed solution (or light emitting element ink), and may be supplied to each emission area EA by an inkjet scheme, a slit coating scheme, and/or the like. Alignment signals may be applied to the alignment electrodes ALE (or the alignment lines) of the pixels PXL simultaneously with or after the supply of the light emitting elements LD. After the alignment of the light emitting elements LD has been completed, a solvent may be removed through a dry process and/or the like.

The first pixel electrode ELT1 (also referred to as "first electrode") may be disposed on the first ends EP1 of the first light emitting elements LD1, and may be electrically connected to the first ends EP1 of the first light emitting elements LD1. For example, the first pixel electrode ELT1 may be directly disposed on the first ends EP1 of the first light emitting elements LD1 so that the first pixel electrode ELT1 can contact the first ends EP1 of the first light emitting elements LD1.

In an embodiment, the first pixel electrode ELT1 may overlap the first alignment electrode ALE1, and may be electrically connected to the first alignment electrode ALE1 through a fourth contactor CNT4. Furthermore, the first pixel electrode ELT1 may be electrically connected to the pixel circuit PXC and/or the first power line PL1 through the first alignment electrode ALE1. In an embodiment, the first pixel electrode ELT1 may be electrically connected to the pixel circuit PXC and/or the first power line PL1 without passing through the first alignment electrode ALE1.

The third pixel electrode ELT3 may be disposed on the second ends EP2 of the first light emitting elements LD1 and the first ends EP1 of the second light emitting elements LD2, and may be electrically connected to the second ends EP2 of the first light emitting elements LD1 and the first ends EP1 of the second light emitting elements LD2. For example, the third pixel electrode ELT3 may be directly disposed on the second ends EP2 of the first light emitting elements LD1 and the first ends EP1 of the second light emitting elements LD2 such that the third pixel electrode ELT3 can contact the second ends EP2 of the first light emitting elements LD1 and the first ends EP1 of the second light emitting elements LD2. The third pixel electrode ELT3 may be an intermediate electrode for electrically connecting the first light emitting elements LD1 and the second light emitting elements LD2 to each other. In an embodiment, the third pixel electrode ELT3 may overlap a portion of each of the first and second alignment electrodes ALE1 and ALE2.

The second pixel electrode ELT2 (also referred to as "second electrode") may be disposed on the second ends EP2 of the second light emitting elements LD2, and may be electrically connected to the second ends EP2 of the second light emitting elements LD2. For example, the second pixel electrode ELT2 may be directly disposed on the second ends EP2 of the second light emitting elements LD2 so that the second pixel electrode ELT2 can contact the second ends EP2 of the second light emitting elements LD2.

In an embodiment, the second pixel electrode ELT2 may overlap the third alignment electrode ALE3, and may be electrically connected to the third alignment electrode ALE3 through a fifth contactor CNT5. Furthermore, the second pixel electrode ELT2 may be electrically connected to the second power line PL2 through the third alignment electrode ALE3. In an embodiment, the second pixel electrode ELT2 may be electrically connected to the second power line PL2 without passing through the third alignment electrode ALE3.

The pixel electrodes ELT (e.g., the first pixel electrode ELT1, the second pixel electrode ELT2, and the third pixel electrode ELT3) may be formed separately from each other in each emission area EA. In an embodiment, at least one pixel electrode ELT may extend from each emission area EA to the non-emission area NEA and/or the separation area SPA. For example, the first pixel electrode ELT1 and the second pixel electrode ELT2 may extend from each emission area EA to the non-emission area NEA and the separation area SPA, and may be respectively electrically connected to the first alignment electrode ALE1 and the third alignment electrode ALE3 in the separation area SPA. The third pixel electrode ELT3 may be formed only in each emission area EA, or a portion thereof may be located in the non-emission area NEA. The locations, sizes, shapes, and mutual disposition structure of the pixel electrodes ELT, the locations of the fourth and fifth contactors CNT4 and CNT5, and/or the like may be changed in various ways depending on embodiments.

The bank patterns BNP (also referred to as "patterns" or "wall patterns") may be disposed under the alignment electrodes ALE so that the bank patterns BNP can overlap a portion of the alignment electrodes ALE. For example, the bank patterns BNP may include a first bank pattern BNP1, a second bank pattern BNP2, and a third bank pattern BNP3 which respectively overlap a portion of the first alignment electrode ALE1, a portion of the second alignment electrode ALE2, and a portion of the third alignment electrode ALE3. In an embodiment, at least one bank pattern BNP may extend to the non-emission area NEA around the emission area EA, but the disclosure is not limited thereto.

Portions of the alignment electrodes ALE may protrude in an upward direction of the pixel PXL (e.g., in the third direction DR3) by the bank patterns BNP. Hence, an area in which the light emitting elements LD are to be aligned may be readily controlled, and light emitted at a low angle toward the bank patterns BNP among light emitted from the light emitting elements LD may be reflected in the upward direction of the pixel PXL so that the light efficiency of the pixel PXL can be enhanced.

In an embodiment, at least two adjacent pixels PXL may share at least one bank pattern BNP. For example, the second bank pattern BNP2 may be integrally formed with the third bank pattern BNP3 of an adjacent pixel PXL (e.g., a right adjacent pixel) in the first direction DR1. Likewise, the third bank pattern BNP3 may be integrally formed with the second bank pattern BNP2 of another adjacent pixel PXL (e.g., a left adjacent pixel) in the first direction DR1. The locations, structures, number, shapes, and/or the like of the bank patterns BNP may be changed in various ways.

The non-emission area NEA may be disposed around each emission area EA and/or each separation area SPA. A first bank BNK1 may be disposed in the non-emission area NEA.

The first bank BNK1 may include a first opening OPA1 corresponding to each emission area EA, and may enclose the emission area EA. Furthermore, the first bank BNK1 may include second openings OPA2 corresponding to the separation areas SPA, and enclose the separation areas SPA. For example, the first bank BNK1 may include multiple openings OPA corresponding to the respective emission areas EA and the respective separation areas SPA.

The first bank BNK1 may include at least one light shielding and/or reflective material. For example, the first bank BNK1 may include at least one black matrix material and/or color filter material for a specific color. Therefore, a light leakage between adjacent pixels PXL may be prevented from being caused.

The first bank BNK1 may define each emission area EA to which the light emitting elements LD are to be supplied, at the step of supplying the light emitting elements LD to each pixel PXL. For example, as the emission areas EA of the pixels PXL are separated and defined by the first bank BNK1, a desired kind and/or amount of light-emitting-element mixed solution can be supplied to each emission area EA.

In an embodiment, the first bank BNK1 may include a hydrophobic surface. For example, the first bank BNK1 itself may be formed as a hydrophobic pattern using hydrophobic material. In other embodiments, a hydrophobic film made of hydrophobic material may be formed on the first bank BNK1 so that the first bank BNK1 can have a hydrophobic surface. For example, the first bank BNK1 may be formed of hydrophobic organic insulating material such as polyacrylate having a relatively large contact angle, whereby the first bank BNK1 may be formed as a hydrophobic pattern. Therefore, the light-emitting-element mixed solution may reliably flow into the emission area EA.

FIG. 23 is a sectional view schematically illustrating an embodiment of the display device DD of FIG. 19. For example, FIG. 23 illustrates an embodiment of a cross-section of the display device DD, centered on a cross-section of the pixel PXL corresponding to like II-II' of FIG. 22.

Referring to FIGS. 1 to 23, the display device DD may include a base layer BSL, a circuit layer PCL, and a display layer DPL. The circuit layer PCL and the display layer DPL may be provided on the base layer BSL such that the layers overlap each other. For example, the circuit layer PCL and the display layer DPL may be successively disposed on a surface of the base layer BSL.

The display device DD may further include a color filter layer CFL and/or an encapsulation layer ENC (or a protective layer) which are disposed on the display layer DPL. In an embodiment, the color filter layer CFL and/or the encapsulation layer ENC may be directly formed on a surface of the base layer BSL on which the circuit layer PCL and the display layer DPL are formed, but the disclosure is not limited thereto.

The base layer BSL may be a substrate or film made of hard or flexible material. In an embodiment, the base layer BSL may include at least one transparent or opaque insulating material, and have a single-layer or multi-layer structure.

The circuit layer PCL may be provided on a surface of the base layer BSL. The circuit layer PCL may include circuit elements which form the pixel circuit PXC of each pixel PXL. For example, multiple circuit elements (e.g., transistors M and a capacitor Cst that form each pixel circuit PXC) may be formed in each pixel area of the circuit layer PCL.

FIG. 23 illustrates any one transistor M (e.g., a first transistor M1 including a bottom metal layer BML) provided in each pixel circuit PXC as an example of circuit elements that can be disposed in the circuit layer PCL.

Furthermore, the circuit layer PCL may include various signal lines and power lines which are connected to the pixels PXL. For example, the circuit layer PCL may include scan lines SL, control lines SSL, data lines DL, sensing lines SENL, and/or first and second power lines PL1 and PL2 which are connected to the pixels PXL. FIG. 23 illustrates lines LI located in a layer (e.g., a first conductive layer) identical to the bottom metal layer BML as an example of lines that can be disposed in the circuit layer PCL. Each line LI may be any one of signal lines and power lines that are connected to the pixels PXL. In an embodiment, at least one signal line and/or power line may also be disposed in other layers of the circuit layer PCL.

The circuit layer PCL may include multiple insulating layers. For example, the circuit layer PCL may include a buffer layer BFL, a gate insulating layer GI, an interlayer insulating layer ILD, and/or a passivation layer PSV which are successively disposed on a surface of the base layer BSL.

The circuit layer PCL may be disposed on the base layer BSL, and include a first conductive layer including the bottom metal layer BML of the first transistor M1. For example, the first conductive layer may be disposed between the base layer BSL and the buffer layer BFL, and include the bottom metal layer BML of the first transistor M1 provided in each pixel circuit PXC. The bottom metal layer BML of the first transistor M1 may overlap a gate electrode GE and a semiconductor pattern SCP of the first transistor M1.

Furthermore, the first conductive layer may further include at least one line LI. For example, the first conductive layer may include at least some lines LI among lines extending in the second direction DR2 in the display area DA. For example, the first conductive layer may include the sensing lines SENL and the data lines DL that are connected to the pixels PXL, the first power line PL1 (or a first sub-power line that forms the first power line PL1 having a mesh structure and extends in the second direction), and/or the second power line PL2 (or a second sub-power line that forms the second power line PL2 having a mesh structure and extends in the second direction).

The buffer layer BFL may be disposed on the surface of the base layer BSL including the first conductive layer. The buffer layer BFL may prevent impurities from diffusing into each circuit element.

A semiconductor layer may be disposed on the buffer layer BFL. The semiconductor layer may include a semiconductor pattern SCP of each transistor M. The semiconductor pattern SCP may include a channel area which overlaps the gate electrode GE of the corresponding transistor M, and first and second conductive areas (e.g., source and drain areas) disposed on opposite sides of the channel area. The semiconductor pattern SCP may be a semiconductor pattern formed of polysilicon, amorphous silicon, an oxide semiconductor, and/or the like.

A gate insulating layer GI may be disposed on the semiconductor layer. A second conductive layer may be disposed on the gate insulating layer GI.

The second conductive layer may include the gate electrode GE of each transistor M. Furthermore, the second conductive layer may further include a bridge pattern and/or one electrode of the capacitor Cst provided in the pixel circuit PXC. In the case where at least one power line and/or signal line disposed in the display area DA has a multi-layer structure, the second conductive layer may further include at least one conductive pattern that forms the at least one power line and/or signal line.

An interlayer insulating layer ILD may be disposed on the second conductive layer. A third conductive layer may be disposed on the interlayer insulating layer ILD.

The third conductive layer may include a source electrode SE and a drain electrode DE of each transistor M. The source electrode SE may be connected to one area (e.g., a source area) of the semiconductor pattern SCP included in the corresponding transistor M through at least one contact hole CH. The drain electrode DE may be connected to another area (e.g., a drain area) of the semiconductor pattern included in the corresponding transistor M through at least one other contact hole CH. Furthermore, the third conductive layer may further include a bridge pattern, lines, and/or another electrode of the capacitor Cst provided in the pixel circuit PXC. For example, the third conductive layer may include at least some lines among lines extending in the first direction DR1 in the display area DA. For example, the third conductive layer may include the scan lines SL, the control lines SSL, the first power line PL1 (or a first sub-power line that forms the first power line PL1 having a mesh structure and extends in the first direction), and/or the second power line PL2 (or a second sub-power line that forms the second power line PL2 having a mesh structure and extends in the first direction) that are connected to the pixels PXL. In the case where at least one power line and/or signal line disposed in the display area DA has a multi-layer structure, the third conductive layer may further include at least one conductive pattern that forms the at least one power line and/or signal line.

Each of the conductive patterns, the electrodes, and/or the lines that are provided to form the first to third conductive layers may include at least one conductive material and thus have conductivity, and the constituent material thereof is not particularly limited. For example, each of the conductive patterns, the electrodes, and/or the lines that are provided to form the first to third conductive layers may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chrome (Cr), titanium (Ti), tantalum (Ta), tungsten (W), and copper (Cu), and may include various other conductive materials.

The passivation layer PSV may be disposed on the third conductive layer. Each of the buffer layer BFL, the gate insulating layer GI, the interlayer insulating layer ILD, and the passivation layer PSV may have a single-layer structure or a multi-layer structure, and include at least one inorganic insulating material and/or organic insulating material. In an embodiment, each of the buffer layer BFL, the gate insulating layer GI, the interlayer insulating layer ILD may include various kinds of inorganic materials including silicon nitride ($SiN_x$), silicon oxide ($SiO_x$), silicon oxynitride ($SiO_xN_y$), and/or the like. In an embodiment, the passivation layer PSV may include at least one organic insulating layer including at least one organic insulating material. In an embodiment, the passivation layer PSV may be disposed on an overall surface of at least the display area DA, and may planarize a surface of the circuit layer PCL.

The display layer DPL may be disposed on the passivation layer PSV.

The display layer DPL may include an emission circuit EMU of each pixel PXL. For example, the display layer DPL may include alignment electrodes ALE, at least one light emitting element LD, and pixel electrodes ELT that are disposed in the emission area EA of each pixel PXL. In an embodiment, the emission component EMU may include multiple light emitting elements LD.

Furthermore, the display layer DPL may further include insulating patterns and/or insulating layers that are successively disposed on a surface of the base layer BSL in which the circuit layer PCL is formed. For example, the display layer DPL may further include bank patterns BNP, a first insulating layer INS1, a first bank BNK1, a second insulating layer INS2, a third insulating layer INS3, a second bank BNK2, and/or a fourth insulating layer INS4. Furthermore, the display layer DPL may selectively further include a light conversion layer CCL.

The bank patterns BNP may be disposed on the passivation layer PSV. The bank patterns BNP may be disposed under the alignment electrodes ALE such that the bank patterns BNP overlap respective portions of the alignment electrodes ALE.

The alignment electrodes ALE may protrude in an upward direction of the pixel PXL (e.g., in the third direction DR3) by the bank patterns BNP. The bank patterns BNP and the alignment electrodes ALE that are provided over the bank patterns BNP may form a reflective protruding pattern around the light emitting elements LD. Consequently, the light efficiency of the pixel PXL may be enhanced.

The bank patterns BNP may be single-layer or multi-layer insulating patterns including inorganic insulating material and/or organic insulating material. The alignment electrodes ALE may be disposed on the bank patterns BNP.

The alignment electrodes ALE may include at least one conductive material. For example, each of the alignment electrodes ALE may include at least one conductive material among at least one metal of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., or an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as PEDOT, but the disclosure is not limited thereto. For example, the alignment electrodes ALE may include other conductive materials including a carbon nano tube, a graphene, and the like. In other words, the alignment electrodes ALE may include at least one of various conductive materials and thus have conductivity. Furthermore, the alignment electrodes ALE may include identical or different conductive materials.

Each of the alignment electrodes ALE may have a single-layer or multi-layer structure. For example, each of the alignment electrodes ALE may include a reflective electrode layer including reflective conductive material (e.g., metal), and may be formed of a single-layer or multi-layer electrode.

The first insulating layer INS1 may be disposed on the alignment electrodes ALE. In an embodiment, the first insulating layer INS1 may include a contact hole through which at least one of the alignment electrodes ALE may be connected to any one pixel electrode ELT. For example, the first insulating layer INS1 may include contact holes for forming the fourth and fifth contactors CNT4 and CNT5 of FIG. 21.

The first insulating layer INS1 may have a single-layer or multi-layer structure, and include inorganic insulating material and/or organic insulating material. In an embodiment, the first insulating layer INS1 may include at least one kind of inorganic insulating material such as silicon nitride ($SiN_x$), silicon oxide ($SiO_x$), and/or silicon oxynitride ($SiO_xN_y$).

As the alignment electrodes ALE are covered with the first insulating layer INS1, the alignment electrodes ALE may be prevented from being damaged during a subsequent process. Furthermore, the alignment electrodes ALE and the light emitting elements LD may be prevented from being inappropriately connected to each other and thus short-circuiting with each other.

The first bank BNK1 may be disposed in the display area DA in which the alignment electrodes ALE and the first insulating layer INS1 are formed. The first bank BNK1 may be formed in the non-emission area NEA to enclose the emission area EA of each pixel PXL.

The light emitting elements LD may be supplied to each emission area EA enclosed by the first bank BNK1. The light emitting elements LD may be aligned between the alignment electrodes ALE by alignment signals that are applied to the alignment electrodes ALE (or the alignment lines provided before being divided into the alignment electrodes ALE of each pixel PXL). For example, in the case where the pixel PXL includes the first alignment electrode ALE1 disposed in the central portion and the second and third alignment electrodes ALE2 and ALE3 disposed on opposite sides of the first alignment electrode ALE1, at least one first emission element LD1 may be aligned between the first alignment electrode ALE1 and the second alignment electrode ALE2, and at least one second light emitting element LD2 may be aligned between the first alignment electrode ALE1 and the third alignment electrode ALE3.

The second insulating layer INS2 may be disposed on portions of the light emitting elements LD. In an embodiment, the second insulating layer INS2 may be sectionally disposed on portions of the light emitting elements LD including central portions of the light emitting elements LD such that the first and second ends EP1 and EP2 of the light emitting elements LD aligned in the emission area EA of the corresponding pixel PXL are exposed. In an embodiment, the second insulating layer INS2 may be formed in the overall surface of the display area DA including multiple pixel areas, and include contact holes through which the respective first ends EP1 and the respective second ends EP2 of the light emitting elements LD are exposed. In the case where the second insulating layer INS2 is formed over the light emitting elements LD, the light emitting elements LD can be stably fixed.

The second insulating layer INS2 may have a single-layer or multi-layer structure, and include at least one inorganic insulating material and/or organic insulating material. For example, the second insulating layer INS2 may include various kinds of organic and/or inorganic insulating materials including silicon nitride ($SiN_x$), silicon oxide ($SiO_x$), silicon oxynitride ($SiO_xN_y$), aluminum oxide ($Al_xO_y$), photoresist material, and the like.

Different electrodes ELT may be disposed and/or formed on the opposite ends of the light emitting elements LD, i.e., the first and second ends EP1 and EP2, which are not covered with the second insulating layer INS2. For example, the first pixel electrode ELT1 may be disposed on the first end EP1 of the first light emitting element LD1. A portion of the third pixel electrode ELT3 may be disposed on the second end EP2 of the first light emitting element LD1. Another portion of the third pixel electrode ELT3 may be disposed on the first end EP1 of the second light emitting element LD2. The second pixel electrode ELT2 may be disposed on the second end EP2 of the second light emitting element LD2.

In an embodiment, the first pixel electrode ELT1 may be electrically connected to the first alignment electrode ALE1 through at least one contactor (e.g., the fourth contactor CNT4 of FIG. 22). Likewise, the second pixel electrode ELT2 may be electrically connected to the third alignment electrode ALE3 through at least one contactor (e.g., the fifth contactor CNT5 of FIG. 22). The third pixel electrode ELT3 may electrically connect at least one first light emitting element LD1 to at least one second light emitting element LD2.

In an embodiment, the first alignment electrode ALE1 of each pixel PXL may be electrically connected to the first transistor M1 of the corresponding pixel PXL through at least one contactor (e.g., the first contactor CNT1 of FIG. 21). Likewise, each of the second and third alignment electrodes ALE2 and ALE3 may be electrically connected to the second power line PL2 through at least one contactor (e.g., the second contactor CNT2 and the third contactor CNT3 of FIG. 22).

The first pixel electrode ELT1 may be disposed over the first alignment electrode ALE1 to overlap a portion of the first alignment electrode ALE1. The second pixel electrode ELT2 may be disposed over the third alignment electrode ALE3 to overlap a portion of the third alignment electrode ALE3. The third pixel electrode ELT3 may be disposed over the first alignment electrode ALE1 and the second alignment electrode ALE2 to overlap another portion of the first alignment electrode ALE1 and the second alignment electrode ALE2.

In an embodiment, the first pixel electrode ELT1 may be electrically connected to the first end EP1 of the first light emitting element LD1. The second pixel electrode ELT2 may be electrically connected to the second end EP2 of the second light emitting element LD2. The third pixel electrode ELT3 may be electrically connected to the second end EP2 of the first light emitting element LD1 and the first end EP1 of the second light emitting element LD2.

The first pixel electrode ELT1, the second pixel electrode ELT2, and/or the third pixel electrode ELT3 may be formed in the same layer or different layers. In an embodiment, the first and second pixel electrodes ELT1 and ELT2 may be formed in the same layer. The third pixel electrode ELT3 may be formed in a layer different from the first and second pixel electrodes ELT1 and ELT2. For example, the first and second pixel electrodes ELT1 and ELT2 and the third pixel electrode ELT3 may be disposed in different layers with the third insulating layer INS3 interposed therebetween. In an embodiment, all of the first to third electrodes ELT1 to ELT3 may be formed in the same layer. The pixel PXL may not include the third insulating layer INS3. The mutual position, formation sequence, and/or the like of the pixel electrodes ELT may be changed in various ways, depending on embodiments.

In the case where, as illustrated in an embodiment of FIG. 20, each pixel PXL includes an emission component EMU having a parallel structure or each pixel PXL includes a single light emitting element LD, the pixel PXL may not include the third pixel electrode ELT3. The first pixel electrode ELT1 may be disposed on the first ends EP1 of the light emitting elements LD, and the second pixel electrode ELT2 may be disposed on the second ends EP2 of the light emitting elements LD.

The pixel electrodes may include at least one conductive material. In an embodiment, the pixel electrodes ELT may include transparent conductive material to allow light emitted from the light emitting elements LD to pass therethrough.

In an embodiment, the display device DD may include a light conversion layer CCL disposed on the emission component EMU of each pixel PXL. For example, the light conversion layer CCL may be provided in each emission area EA such that the light conversion layer CCL is located over the light emitting elements LD of each pixel PXL.

Furthermore, the display device DD may further include the second bank BNK2 disposed in the non-emission area NEA to overlap the first bank BNK1. The second bank BNK2 may define (or partition) each emission area EA in which the light conversion layer CCL is to be formed. In an embodiment, the second bank BNK2 may be integrated with the first bank BNK1.

The second bank BNK2 may include light blocking and/or reflective material including black matrix material. The second bank BNK2 may have material identical to or different from that of the first bank BNK1.

The light conversion layer CCL may include at least one of wavelength conversion particles (or color conversion particles) for converting the wavelength and/or color of light emitted from the light emitting elements LD, and light scattering particles SCT for scattering light emitted fro the light emitting elements LD to enhance light output efficiency of the pixel PXL. For example, the light conversion layer CCL may be disposed on each emission component EMU. Each light conversion layer CCL may include wavelength conversion particles such as at least one kind of quantum dots QD (e.g., red, green, and/or blue quantum dots), and/or light scattering particles SCT.

For example, in the case where any one pixel PXL is set to a red (or green) pixel and blue light emitting elements LD are provided in the emission component EMU of the pixel PXL, the color conversion layer CCL including red (or green) quantum dots QD for converting blue light to red (or green) light may be disposed over the emission component EMU of the pixel PXL. The light conversion layer CCL may further include light scattering particles SCT.

The fourth insulating layer INS4 may be formed on a surface of the base layer BSL including the emission components EMU and/or the light conversion layers CCL of the pixels PXL.

In an embodiment, the fourth insulating layer INS4 may include at least one organic layer. The fourth insulating layer INS4 may be disposed in the overall surface of at least the display area DA, and planarize the surface of the display layer DPL. Furthermore, the fourth insulating layer INS4 may protect the emission components EMU and/or the light conversion layers CCL of the pixels PXL.

The color filter layer CFL may be disposed on the fourth insulating layer INS4.

The color filter layer CFL may include color filters CF corresponding to the colors of the pixels PXL. For example, the color filter layer CFL may include a first color filter CF1 disposed on the emission area EA of the first-color pixel PXL1, a second color filter CF2 disposed on the emission area EA of the second-color pixel PXL2, and a third color filter CF3 disposed on the emission area EA of the third-color pixel PXL3. Each color filter CF may be provided on the fourth insulating layer INS4 to overlap the emission component EMU of the corresponding pixel PXL.

In an embodiment, the first, second, and third color filters CF1, CF2, and CF3 may be disposed in the non-emission area NEA and overlap each other. In an embodiment, the first, second, and third color filters CF1, CF2, and CF3 may be formed separately from each other over the emission area EA of each pixel PXL. A separate light blocking pattern or the like may be disposed between the first, second, and third color filters CF1, CF2, and CF3.

The encapsulation layer ENC may be disposed on the color filter layer CFL. The encapsulation layer ENC may include a fifth insulating layer INS5. In an embodiment, the fifth insulating layer INS5 may include at least one organic insulating layer including at least one organic insulating material, and may have a single-layer or multi-layer structure. The fifth insulating layer INS5 may be formed in the overall surface of the display area DA to cover the circuit layer PCL, the display layer DPL, and/or the color filter layer CFL, and may planarize the surface of the display device DD.

Figure 24:
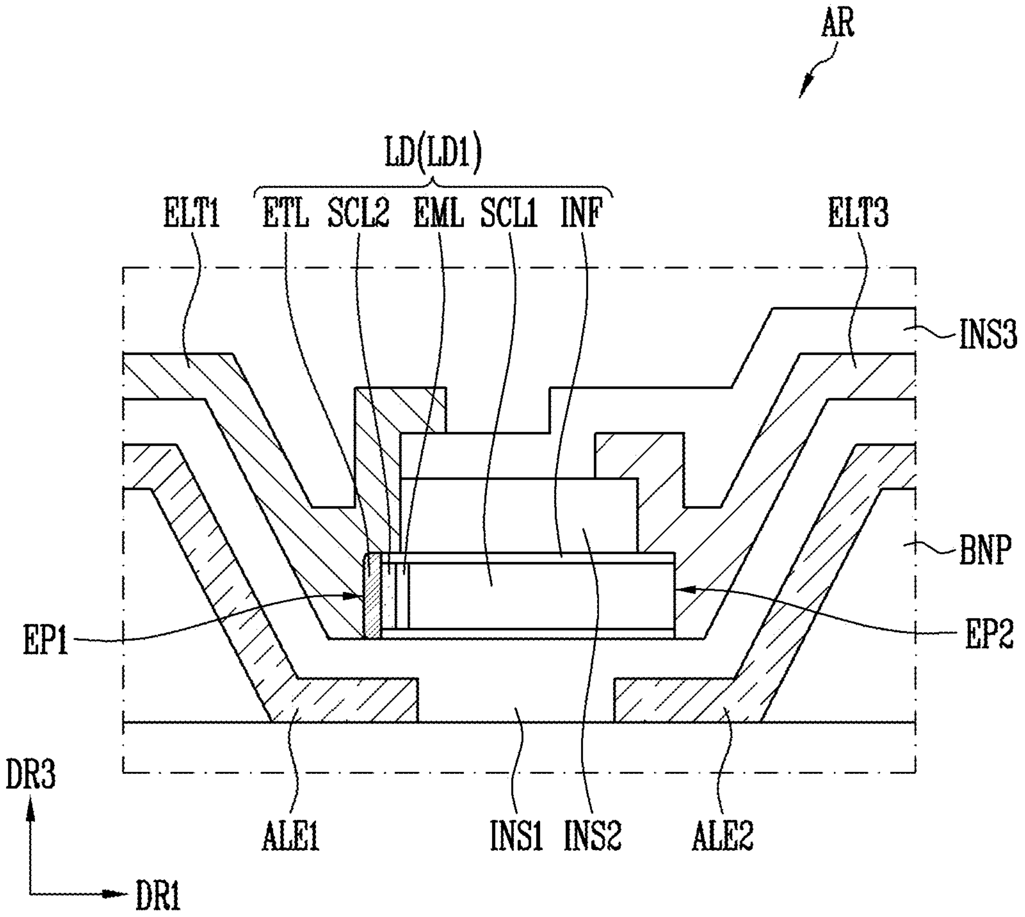
FIG. 24 is an enlarged sectional view schematically illustrating an area of FIG. 23.

FIG. 24 is an enlarged sectional view schematically illustrating an enlargement of an area of FIG. 23. For example, FIG. 24 is a sectional view showing an enlargement of one area (e.g., area AR of FIG. 23) of the pixel PXL, centered on the first light emitting element LD1. In an embodiment, the light emitting elements LD included in the pixels PXL may be light emitting elements LD having substantially identical or similar types and/or structures. For example, the second light emitting element LD2 may be a light emitting element LD having the same type and/or structure as that of the first light emitting element LD1.

Although FIG. 24 illustrates an embodiment in which the pixel PXL of FIG. 23 includes a light emitting element LD according to an embodiment of FIGS. 1 and 2, the disclosure is not limited thereto. For example, the pixel PXL may include a light emitting element LD according to any one of embodiments of FIGS. 6 to 9, or a light emitting element(s) LD having a shape and/or structure according to a combination of at least two of embodiments of FIGS. 1 to 9. In the description of the embodiment of FIG. 24, detailed explanation of configurations similar or identical to those of the embodiments described above will be omitted.

Referring to FIGS. 1 to 24, each light emitting element LD included in the pixel PXL may include a first semiconductor layer SCL1, an emission layer EML, a second semiconductor layer SCL2, and an electrode layer ETL that are successively disposed in a direction from the second end EP2 to the first end EP1. As described with reference to FIGS. 1 and 2, the first semiconductor layer SCL1 and the second semiconductor layer SCL2 may have the same identical (or width). Furthermore, each light emitting element LD may include an insulating film INF which encloses side surfaces of the first semiconductor layer SCL1, the emission layer EML, and the second semiconductor layer SCL2. The electrode layer ETL may cover the second semiconductor layer SCL2 and a portion of the insulating film INF.

The electrode layer ETL may be electrically connected to the first pixel electrode ELT1. For example, the electrode layer ETL may directly contact the first pixel electrode ELT1 on the first end EP1 of the light emitting element LD on which the second insulating layer INS2 is not provided, and thus be electrically connected to the first pixel electrode ELT1.

In an embodiment, the electrode layer ETL may have a bottle cap shape or include a protrusion PRT. A contact area between the electrode layer ETL and the first pixel electrode ELT1 may be increased. Therefore, contact resistance between the electrode layer ETL and the first pixel electrode ELT1 may be reduced, so that the electrode layer ETL can be more reliably connected to the first pixel electrode ELT1.

In an embodiment, the insulating film may have a uniform thickness along an outer circumferential surface of the light emitting element LD. During a process of forming the second insulating layer INS2 that allows the opposite ends of the light emitting elements LD to be exposed, even if the opposite ends of the light emitting element LD, particularly, the insulating film INF on the opposite ends, is etched, the second semiconductor layer SCL2 (and the emission layer EML) of the light emitting element LD may not be exposed. Therefore, a short circuit on the light emitting element LD can be prevented from occurring. In the case where the electrode layer ETL covers a portion of the insulating film INF, the insulating film INF may not be etched, so that a short circuit on the light emitting element LD can be more reliably prevented from occurring.

The first semiconductor layer SCL1 may be electrically connected to the third pixel electrode ELT3 (and/or the second pixel electrode ELT2). For example, the first semiconductor layer SCL1 may directly contact the third pixel electrode ELT3 on the second end EP2 of the light emitting element LD on which the second insulating layer INS2 is not provided, and thus be electrically connected to the third pixel electrode ELT3.

In a light emitting element in accordance with embodiments of the disclosure, a first semiconductor layer and a second semiconductor layer may have the same diameter (or width), deterioration in light characteristics attributable to protrusion of the second semiconductor layer may be prevented. In other words, the light characteristics of the light emitting element may be enhanced.

Furthermore, because the first semiconductor layer and the second semiconductor layer of the light emitting element have the same diameter (or width), an insulating film may have a uniform thickness in an overall area enclosing the second semiconductor layer, the emission layer, and the first semiconductor layer. Because the electrode layer partially covers the insulating film, the insulating film may not be removed during a subsequent process so that the second semiconductor layer and the emission layer may not be exposed. Therefore, a short circuit of the light emitting element may be prevented from occurring attributable to exposure of the second semiconductor layer and the emission layer.

Because the electrode layer of the light emitting element has a bottle cap shape or includes a protrusion, the electrode layer may have a relatively large (or wide) surface area (or contact area). Therefore, the electrode layer may be more reliably connected to an electrode or a line through a relatively large contact surface.

The effects of the disclosure are not limited by the foregoing, and other various effects are anticipated herein.

While the spirit and scope of the disclosure are described by detailed embodiments, it should be noted that the above-described embodiments are merely descriptive and should not be considered limiting. It should be understood by those skilled in the art that various changes may be made herein without departing from the scope of the disclosure.

The scope of the disclosure is not limited by detailed descriptions of the specification. Furthermore, all changes or modifications of the disclosure should be construed as being included in the scope of the disclosure.

What is claimed is:

1. A light emitting element, comprising:
- a first semiconductor layer;
- an emission layer disposed on the first semiconductor layer;
- a second semiconductor layer disposed on the emission layer;
- an insulating film enclosing a side surface of the first semiconductor layer, a side surface of the emission layer, and a side surface of the second semiconductor layer; and
- an electrode layer disposed on the second semiconductor layer and the insulating film,
- wherein the insulating film does not enclose the electrode layer,
- wherein, in a plan view, the electrode layer comprises a plurality of protrusions, each of the plurality of protrusions crossing a virtual outer peripheral profile of the light emitting element,
- wherein the virtual outer peripheral profile is a virtual hexagon, and
- wherein the plurality of protrusions comprises at least two protrusions along each side of the virtual hexagon.

2. The light emitting element according to claim 1, wherein
- an upper surface of the second semiconductor layer and an upper surface of the insulating film are located in a substantially identical plane, and
- the electrode layer is directly disposed on the upper surface of the insulating film.

3. The light emitting element according to claim 1, wherein a diameter of the first semiconductor layer and a diameter of the second semiconductor layer are substantially identical to each other.

4. The light emitting element according to claim 3, wherein a thickness of a portion of the insulating film that physically contacts the second semiconductor layer and a thickness of another portion of the insulating film that physically contacts the first semiconductor layer are substantially identical to each other.

5. The light emitting element according to claim 1, wherein the electrode layer has a bottle cap shape.

6. The light emitting element according to claim 1, wherein, in a plan view, a diameter of the electrode layer is greater than a diameter of the insulating film.

7. The light emitting element according to claim 6, wherein the electrode layer partially covers a side surface of the insulating film that is adjacent to an upper surface of the insulating film.

8. The light emitting element according to claim 7, wherein, relative to an upper surface of the second semiconductor layer, the electrode layer has an inclination angle of about 90° or less.

9. The light emitting element according to claim 7, wherein, relative to an upper surface of the second semiconductor layer, the electrode layer has an inclination angle of about 90° or more.

10. The light emitting element according to claim 1, wherein, on a boundary between the insulating film and the electrode layer, a diameter of the electrode layer is greater than a diameter of the second semiconductor layer and less than a diameter of the insulating film.

11. The light emitting element according to claim 10, wherein, relative to an upper surface of the second semiconductor layer, the electrode layer has an inclination angle of about 90° or less.

12. The light emitting element according to claim 10, wherein, relative to an upper surface of the second semiconductor layer, the electrode layer has an inclination angle of about 90° or more.

13. A display device, comprising:
- a pixel comprising:
  - a first electrode;
  - a second electrode; and
  - a light emitting element including a first end electrically connected to the first electrode, and a second end electrically connected to the second electrode,
- wherein
- the light emitting element comprises:
  - a first semiconductor layer, an emission layer, a second semiconductor layer, and an electrode layer that are successively disposed in a direction from the second end to the first end; and
  - an insulating film enclosing a side surface of the first semiconductor layer, a side surface of the emission layer, and a side surface of the second semiconductor layer,
- the electrode layer partially covers the insulating film, and the insulating film does not enclose the electrode layer,
- wherein, in a plan view, the electrode layer comprises a plurality of protrusions, each of the plurality of protrusions crossing a virtual outer peripheral profile of the light emitting element,
- wherein the virtual outer peripheral profile is a virtual hexagon, and
- wherein the plurality of protrusions comprises at least two protrusions along each side of the virtual hexagon.

14. The display device according to claim 13, wherein a diameter of the first semiconductor layer and a diameter of the second semiconductor layer are substantially identical to each other.

15. The display device according to claim 13, wherein the electrode layer has a bottle cap shape.

16. A method of fabricating a light emitting element, comprising:
- successively forming a first semiconductor layer, an emission layer and a second semiconductor layer on a substrate;
- patterning a stack including the first semiconductor layer, the emission layer, and the second semiconductor layer in a rod shape;
- forming an insulating film on a side surface of the stack;
- forming an electrode layer on the second semiconductor layer and the insulating film; and
- separating a light emitting element including the stack, the insulating film, and the electrode layer from the substrate,
- wherein, in a plan view, the electrode layer comprises a plurality of protrusions, each of the plurality of protrusions crossing a virtual outer peripheral profile of the light emitting element,
- wherein the virtual outer peripheral profile is a virtual hexagon, and
- wherein the plurality of protrusions comprises at least two protrusions along each side of the virtual hexagon.

17. The method according to claim 16, wherein the forming of the electrode layer comprises:

primarily forming, using a sputtering technique, the electrode layer that covers only an upper end of the stack; and etching, using a wet etching technique, the electrode layer primarily formed.

18. The method according to claim 16, wherein a diameter of the first semiconductor layer and a diameter of the second semiconductor layer are substantially identical to each other.

19. The method according to claim 16, wherein the electrode layer has a bottle cap shape.

* * * * *